(12) United States Patent
Kim

(10) Patent No.: US 11,292,121 B2
(45) Date of Patent: Apr. 5, 2022

(54) ROBOT

(71) Applicant: LG ELECTRONICS INC., Seoul (KR)

(72) Inventor: Moonchan Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 343 days.

(21) Appl. No.: 16/422,028

(22) Filed: May 24, 2019

(65) Prior Publication Data

US 2019/0389049 A1    Dec. 26, 2019

(30) Foreign Application Priority Data

Jun. 25, 2018  (KR) .................. 10-2018-0072869

(51) Int. Cl.
*B25J 9/00* (2006.01)
*H04L 12/28* (2006.01)
*H02K 11/33* (2016.01)
*H05K 1/02* (2006.01)

(52) U.S. Cl.
CPC .............. *B25J 9/0003* (2013.01); *B25J 9/00* (2013.01); *B25J 9/0021* (2013.01); *H02K 11/33* (2016.01); *H04L 12/282* (2013.01); *H05K 1/0213* (2013.01); *H02K 2211/03* (2013.01); *H04L 2012/2841* (2013.01)

(58) Field of Classification Search
CPC . G08B 23/00; G08B 5/22; G07C 9/38; G01V 3/08; G01V 3/17; G01V 3/10; G06F 7/72; G06T 11/60; G06K 2209/09; G06K 9/00771; G01R 33/1223; B25J 9/00; H04L 12/28
See application file for complete search history.

(56) References Cited

U.S. PATENT DOCUMENTS

| 7,748,670 | B1 | 7/2010 | Veldez | |
|---|---|---|---|---|
| 10,485,124 | B2 | 11/2019 | Yu et al. | |
| 2008/0095395 | A1* | 4/2008 | Pieklik | A61H 33/60 381/387 |
| 2012/0173018 | A1* | 7/2012 | Allen | G05D 1/0274 700/245 |

(Continued)

FOREIGN PATENT DOCUMENTS

| CN | 105364933 | 10/2017 |
|---|---|---|
| DE | 92 00 618 | 4/1992 |

(Continued)

OTHER PUBLICATIONS

United States Office Action dated May 21, 2021 issued in U.S. Appl. No. 16/421,969.

(Continued)

*Primary Examiner* — Kira Nguyen

(74) *Attorney, Agent, or Firm* — Ked & Associates, LLP

(57) ABSTRACT

A robot includes a spin body, and a drive motor, a spin motor, and a PCB connected electrically to the spin motor and the drive motor mounted on the spin body. Accordingly, the spin motor, the driving motor, and the PCB are rotated together with the spin body, so that relative movement does not occur between the PCB and the respective motors, and tangling or twisting of the connection member electrically connecting the respective motors and the PCB does not occur.

20 Claims, 21 Drawing Sheets

(56) References Cited

U.S. PATENT DOCUMENTS

| | | |
|---|---|---|
| 2012/0197439 A1 | 8/2012 | Wang et al. |
| 2014/0277735 A1 | 9/2014 | Breazeal |
| 2016/0114480 A1 | 4/2016 | Krumbacher et al. |
| 2016/0188977 A1* | 6/2016 | Kearns .................. G05D 1/0274 348/113 |
| 2017/0242478 A1 | 8/2017 | Ma |
| 2017/0312913 A1 | 11/2017 | Cousins |
| 2017/0363932 A1 | 12/2017 | Lim et al. |
| 2018/0241938 A1 | 8/2018 | Buibas et al. |
| 2018/0364870 A1* | 12/2018 | Mei .......................... B25J 9/161 |
| 2018/0376069 A1* | 12/2018 | Makino .................. H04N 5/232 |
| 2019/0126157 A1 | 5/2019 | Hayashi |
| 2019/0143528 A1* | 5/2019 | Hayashi .................. B25J 19/02 700/245 |
| 2019/0275680 A1 | 9/2019 | Zhuang et al. |
| 2019/0329418 A1* | 10/2019 | Sutherland .............. F41H 13/00 |

FOREIGN PATENT DOCUMENTS

| | | |
|---|---|---|
| DE | 10 2013 206791 | 10/2014 |
| JP | 2003-145476 | 5/2003 |
| JP | 2005-279895 | 10/2005 |
| KR | 10-2005-0063113 | 6/2005 |
| KR | 10-2014-0040094 | 4/2014 |
| KR | 10-2016-0034243 | 3/2016 |
| KR | 10-1740704 | 6/2017 |
| KR | 10-2017-0097581 | 8/2017 |
| WO | WO 2018/008385 | 1/2018 |
| WO | WO 2018/016461 | 1/2018 |
| WO | WO 2018/051134 | 3/2018 |

OTHER PUBLICATIONS

Korean Office Action dated Dec. 10, 2019 issued in KR Application No. 10-2018-0072893.
European Search Report dated Jan. 3, 2020 issued in EP Application No. 19181210.6.
U.S. Appl. No. 16/421,969, filed May 24, 2019.
European Search Report dated Oct. 2, 2019.
Korean Office Action dated Dec. 6, 2019.

* cited by examiner

ROBOT

CROSS-REFERENCE TO RELATED APPLICATION

The present application claims priority under 35 U.S.C. 119 and 35 U.S.C. 365 to Korean Patent Application No. 10-2018-0072869, filed on Jun. 25, 2018, which is hereby incorporated by reference in its entirety. This application is also related to U.S. application Ser. No. 16/421,969, filed May 24, 2019, whose entire disclosure is also hereby incorporated by reference.

BACKGROUND

1. Field

A robot having built-in PCBs in disclosed herein.

2. Background

Robots may communicate with humans by voice or gesture and can provide the user with visual information or auditory information. Robots may move in three dimensions while being panned or tilted, and an example of such a robot is disclosed in Korean Patent Laid-Open Publication No. 10-2014-0040094 A (Apr. 2, 2014).

The related art robot includes a head for supporting an interfacing module, a neck, a body, and the like, further includes a rotator for rotating the head with respect to the body and a tilter for tilting the head with respect to the body at a predetermined angle independently of the rotator, and the tilter includes a tilter motor that moves the head between angles of ±90° to the Z-axis.

BRIEF DESCRIPTION OF THE DRAWINGS

Embodiments will be described in detail with reference to the following drawings in which like reference numerals refer to like elements and, wherein.

DETAILED DESCRIPTION

Figure 1:
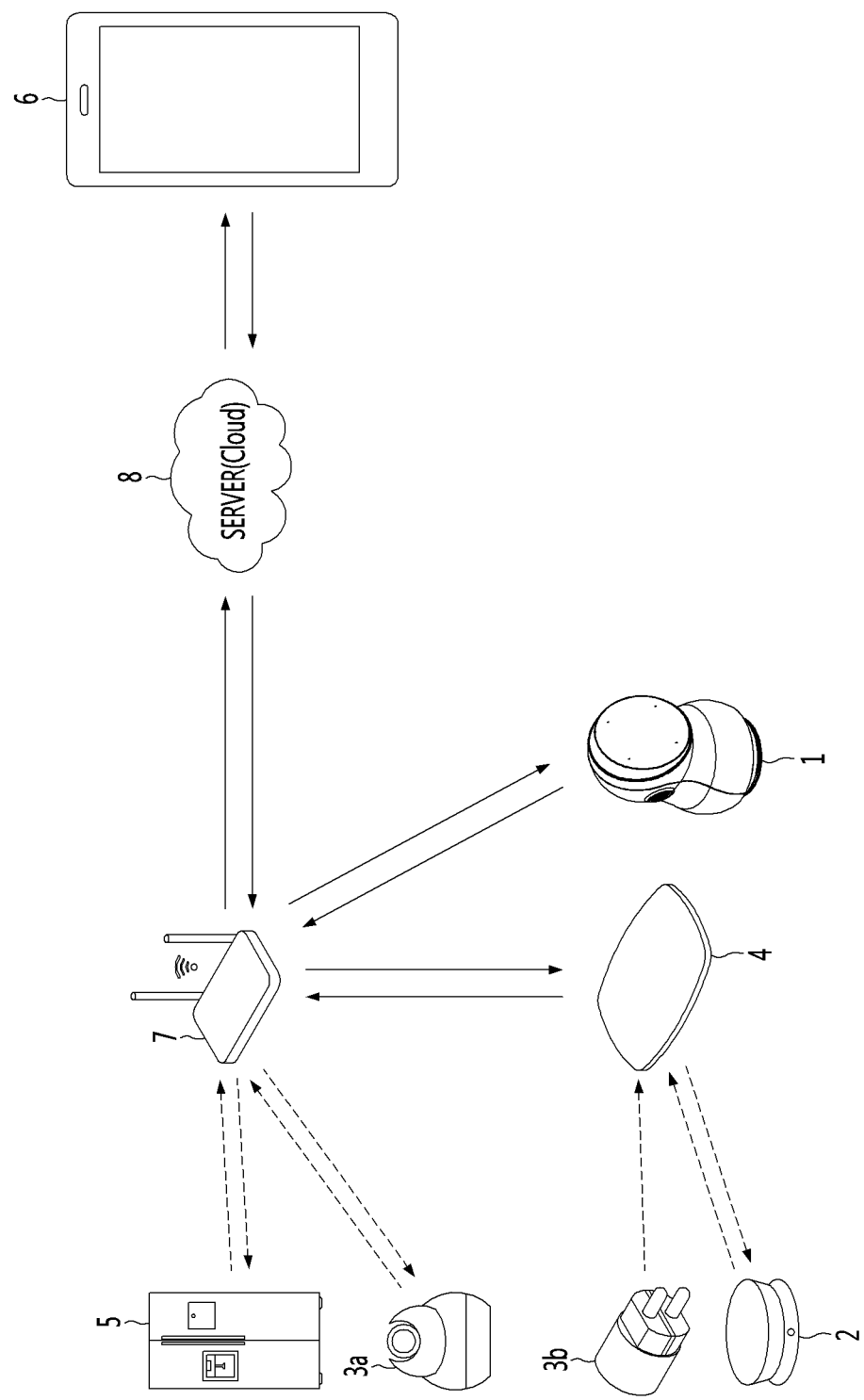
FIG. 1 is a diagram illustrating an example of a network system to which a robot according to an embodiment of the present disclosure is applied.
Figure 2:
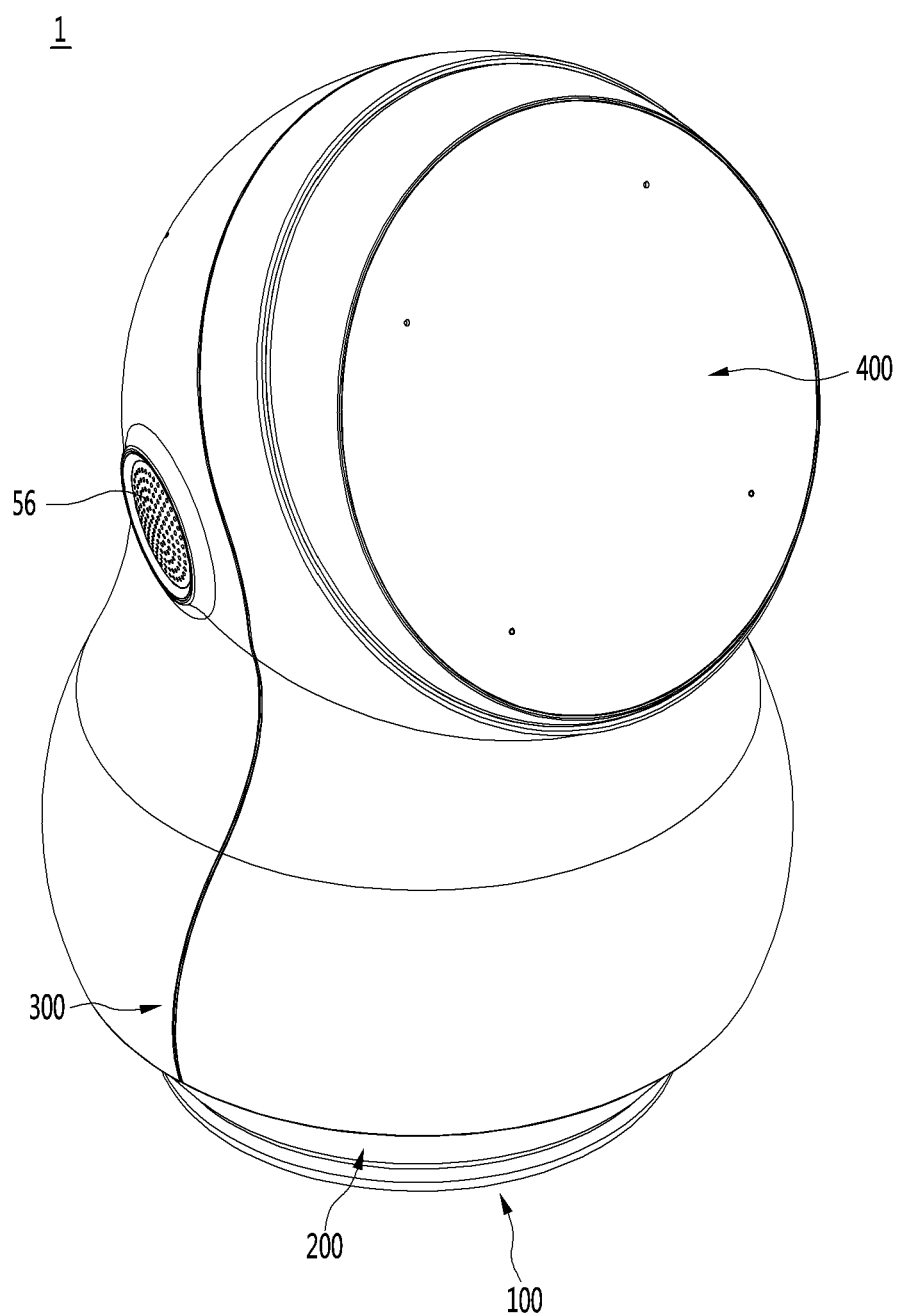
FIG. 2 is a perspective view illustrating the robot according to an embodiment.
Figure 3:
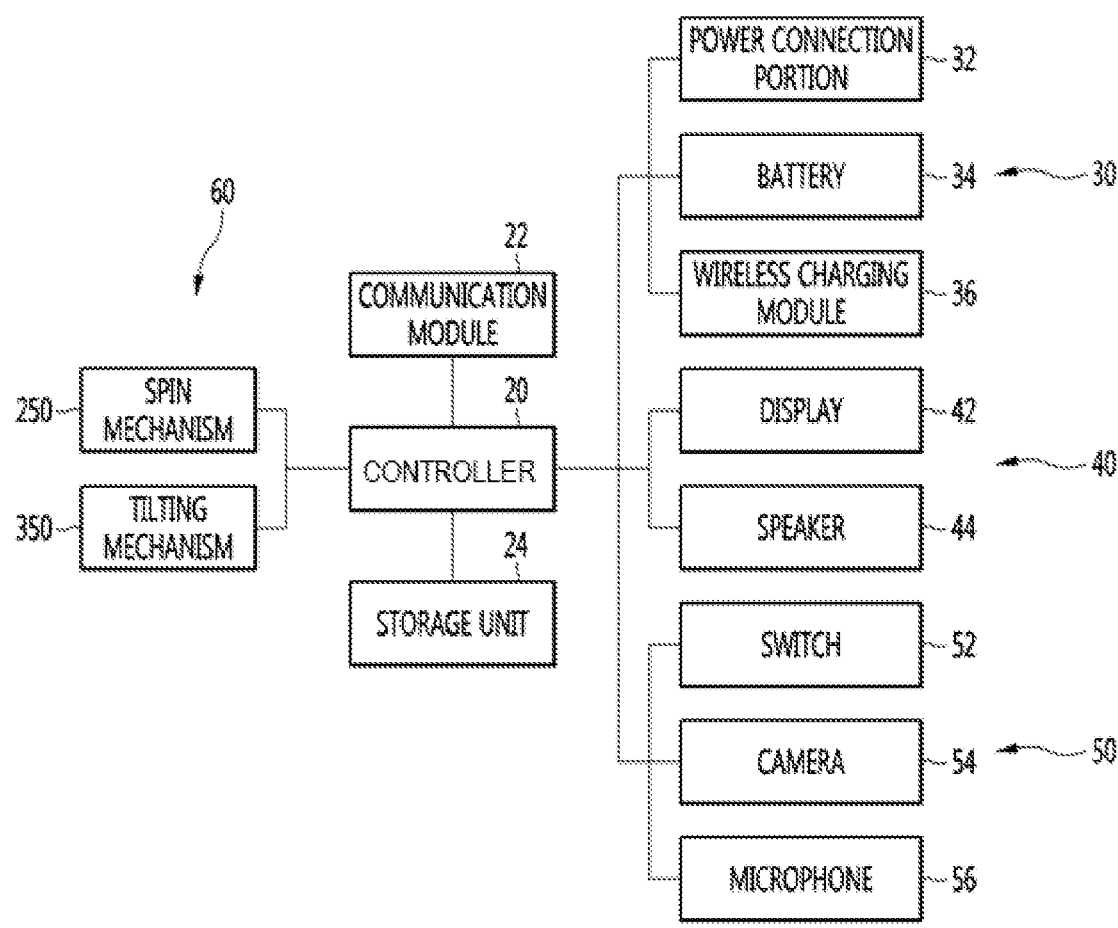
FIG. 3 is a control block diagram of the robot according to an embodiment.
Figure 4:
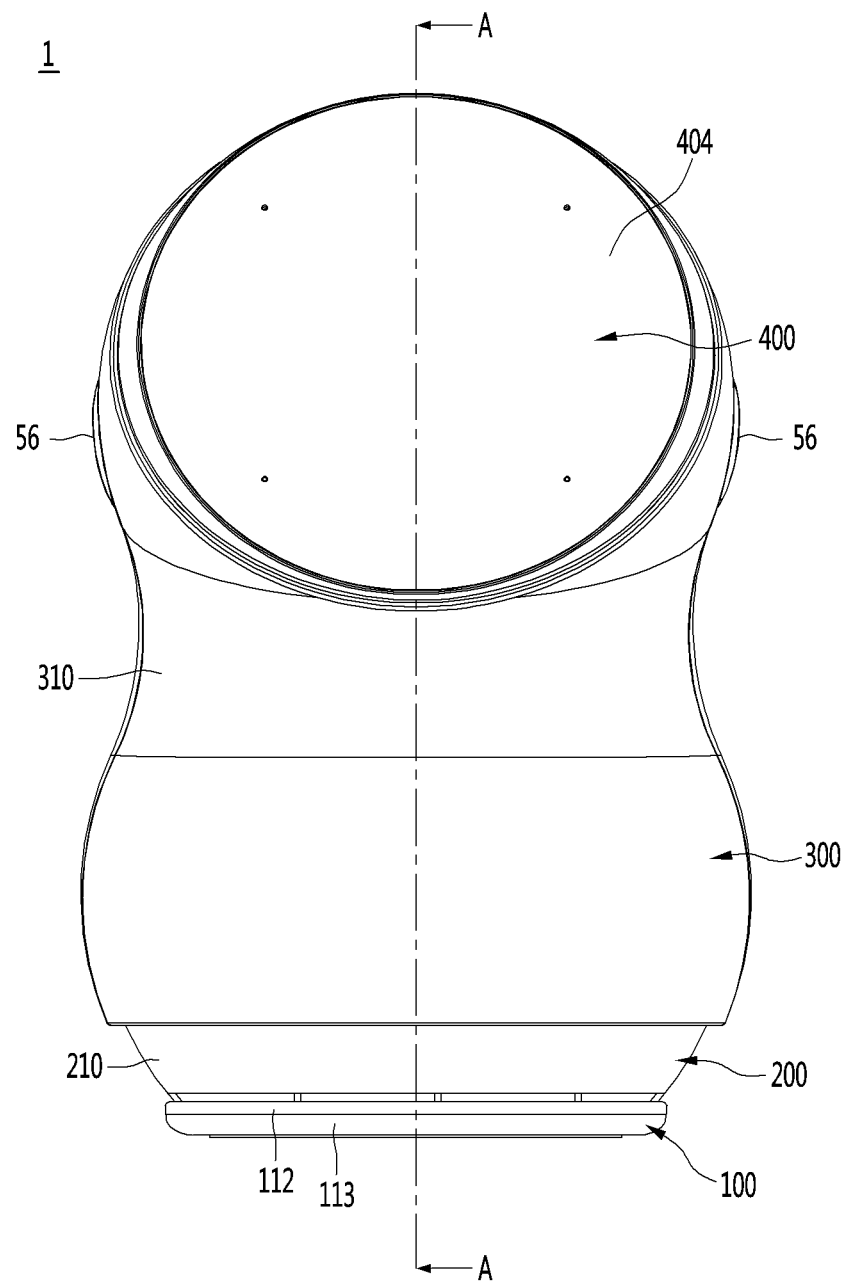
FIG. 4 is a front view illustrating the robot according to an embodiment.

Hereinafter, specific embodiments of the present disclosure will be described in detail with reference to the drawings. As illustrated in FIG. 1, a network system may include a hub robot 1, an accessory 2, 3a, and 3b, a gateway 4, a terminal 6, an access point 7, and a server 8, each of which transmit information to each other through a wired network or a wireless network. Networks may be built based on technologies such as wi-fi, Ethernet, ZigBee, Z-wave, Bluetooth, or the like.

The robot 1, the accessories 2, 3a, and 3b, the gateway 4, and the access point 7 may include a communication module connectable to the network according to a predetermined communication protocol. According to the configuration of the network, a communication module provided in the respective devices 1, 2, 3a, 3b, 4, and 7 constituting the network system may be determined, and according to the communication method between each device and the network or between devices, a plurality of communication modules may be provided in the devices The robot 1 may be connected to the access point 7 via a wired (e.g., Ethernet) or wireless (e.g., wi-fi) communication. The communication between the robot 1 and the accessories 2 and 3b may be performed via the gateway 4 and the access point 7 and as another example, via the access point 7, the communication between the robot 1 and the accessories 3a or other devices 5 may be performed with each other.

A signal transmitted from the accessory 2 and 3b may be transmitted to the robot 1 via the gateway 4 and the access point 7 in order, and the signal transmitted from the robot 1 may be transmitted to the accessory 2 and 3b via the access point 7 and the gateway 4 in order. As another example, a signal transmitted from the accessory 3a or other devices 5 may be transmitted to the robot 1 via the access point 7, and the signal transmitted from the robot 1 may be transmitted via the access point 7 to the accessory 3a or other devices 5.

For example, information acquired by a sensor module of the accessory 2, 3a, and 3b may be transmitted to the server 8, the terminal 6, or the robot 1 via the network. A signal for controlling the sensor module, the control module, or the remote control module from the server 8, the robot 1 or the terminal 6 may be transmitted to the accessory 2. The transmission of such a signal may be made via the gateway 4 and/or the access point 7.

Communication between the accessory 2, 3a, and 3b and the robot 1 may be possible only with the gateway 4 and the access point 7. For example, even in a case where the home network is disconnected from the external communication network such as the Internet, communication between the accessory 2, 3a, and 3b and the robot 1 may be possible.

Information transmitted from the robot 1 or the accessory 2 may be stored in the server 8 when the robot 1 is connected to the server 8 via the access point 7. The information stored in the server 8 may be received by the terminal 6 connected to the server 8.

In addition, the information transmitted from the terminal 6 may be transmitted to the robot 1 or the accessory 2 via the server 8. A smartphone which is a widely used terminal in recent days may provide a convenient UI based on a graphic and therefore it may be possible to control the robot 1 and/or the accessory 2 through the UI or to process and display the information received from the robot 1 and/or the accessory 2. In addition, by updating an application installed on the smartphone, functions that can be implemented through the robot 1 and/or the accessory 2 may be extended.

The terminal 6 and the robot 1 may directly communicate with each other regardless of the server 8. For example, the robot 1 and the terminal 6 may directly communicate with each other using a Blue-Tooth method. It may also be possible to control the accessory 2 or process and display information received from the accessory 2 only by the robot 1 without using the terminal 6.

The network system may be configured without the gateway 4 and the robot 1 may also perform the functions to be performed by the gateway 4. The accessory 2, 3a, and 3b may include at least one communication module to connect with the network. The communication module may communicate with a predetermined network.

The accessory 2, 3a, and 3b may comprise a sensor module configured to sense a predetermined surrounding environment. The accessory 2, 3a, and 3b may include a control module that performs a specific function that affects the surrounding environment. The accessory 2, 3a, and 3b may include a remote control module that transmits an optical signal (e.g., an infrared signal) that controls a given peripheral device.

The accessory 2, 3a, and 3b with the sensor module may include a device with, for example, an air pressure sensor, a humidity sensor, a temperature sensor, a radiation detection sensor, a heat detection sensor, a gas detection sensor, an air quality sensor, an electronic nose sensor, a healthcare sensor, a biometric sensor, a sleep sensor (for example, attached to a user's pajamas or underwear and detecting snoring, apnea, and tossing while the user is sleeping), a proximity sensor, an illuminance sensor, an acceleration sensor, a magnetic sensor, a gravity sensor, a gyroscope sensor, a motion sensor, an RGB sensor, an infrared sensor (IR sensor), an ultrasonic sensor, a remote detection sensor, a SAR, a radar, an optical sensor (for example, an image sensor, an image sensor), or the like, as a number of examples.

The accessory 2, 3a, and 3b with the control module may include, for example, a smart lighting capability to control the lighting, a smart plug to regulate the application and degree of the power supply, a smart temperature regulator to regulate the operation and intensity of the boiler or the air conditioner, and a smart gas lock that controls whether or not the gas is shut off, for example. The accessories 2, 3a, 3b provided with the remote control module may include, for example, a device with an infrared LED or the like that emits an infrared (IR) signal to a remotely controllable household appliance or the like, for example.

The accessories (for example, 3a and 3b) may be installed only for the purpose set to perform a predetermined performance. For example, the accessory 3a may a video camera and the accessory 3b may be a smart plug.

The accessory 2 according to an embodiment may be provided so that the accessory 2 can be installed at any position desired by the user. In addition, it can be provided so as to be utilized for various purposes. For example, the accessory 2 may be attached to an external object such as a household appliance, a door, a window, or a wall body.

The gateway 4 may mediate communication between the at least one accessory 2 and 3b and the access point 7. The gateway 4 may communicate with the accessory 2 wirelessly. The gateway 4 may communicate with the access point 7 by wire or wirelessly. For example, the communication between the gateway 4 and the access point 7 may be based on Ethernet or wi-fi.

The access point 7 may be connected to the server 8 via wired or wireless communication. The server 8 may be connectable via the Internet and may communicate with the server 8 through various terminals 6 connected to the Internet. The terminal 6 may be a mobile terminal such as a personal computer (PC) or a smartphone, for example.

The accessory 2 and 3b may be configured to communicate with the gateway 4. As another example, the accessory 3a may communicate directly with the access point 7 without via the gateway 4.

The access point 7 may directly communicate with the accessory 3a or other devices 5 equipped with the communication module without via the gateway 4. These devices 5 and 3a may be provided with a Wi-Fi communication module so that they can directly communicate with the access point 7 without the gateway 4.

As shown in FIGS. 2-7, a robot 1 according to an embodiment may include a base 100; a spin body 200 rotatably disposed on the base 100; a tilting body 300 supported on the spin body 200 so as to be capable of being tilted by a tilting shaft OT; and at least one interface 42, 44, 54, and 56 installed in at least one of the spin body 200 and the tilting body 300. The base 100 may be positioned at a lowermost end portion of the robot 1. The base 100 may be placed on a floor surface to support the robot 1.

The spin body 200 may be rotatable with respect to the base 100. The spin body 200 may be rotated with respect to the base 100 about the rotation axis OS extending in an up and down or vertical direction. The rotation axis OS may be a virtual axis.

The spin body 200 may be rotated by a predetermined angle, for example by 360 degrees. The spin body 200 may be rotated clockwise or counterclockwise about the rotation axis OS.

The tilting body 300 may be supported on the spin body 200 to be tiltable about a tilting axis OT, which may be horizontal and perpendicular to rotation axis OS. The tilting shaft OT may be elongated in the horizontal direction. The tilting shaft OT may be rotated together with the spin body 200 when the spin body 200 is rotated.

The tilting body 300 may be rotated together with the spin body 200 when the spin body 200 is rotated and may be connected to the spin body 200 to be tiltable. Since the tilting body 300 may be rotated and tilted, the tilting body 300 may have degrees of freedom (DOF) of 2.

The robot 1 may include a control unit or controller 20 configured to control the robot 1. In addition, the controller 20 may be provided in the server 8 or the terminal 6 to control the robot 1 through a network.

The robot 1 may include a communication module 22 configured to communicate with a network. The communication module 22 may include a Wi-Fi module, a Bluetooth module, a ZigBee module, a G-wave module, and the like. The communication module 22 may be changed according to a communication method of a device to be directly communicated. The communication module 22 may communicate with at least one of the access point 7, the gateway 4, the accessories 2, 3a, and 3b, the server 8, and the terminal 6 constituting the network system.

The information acquired from an input unit (or input) 50 through the communication module 22 may be transmitted over the network. Information may be received by the robot 1 on the network via the communication module 22 and the controller 20 may control an output unit (or output) 40 or a drive unit (or drive) 60 based on the received information.

The robot 1 may include a storage unit (or memory) 24 for storing information. The memory 24 may store information received from the network through the communication module 22. The memory 24 may store a command from the input 50. The memory 24 may store information relating to the overall operation of the robot 1 in advance.

The robot 1 may include a power supply device 30 for supplying power to the respective configurations of the robot 1. The power supply device 30 may include a power connection portion 32 which may connect an external wired power cable. The power connection portion 32 may be implemented as a socket. The power supply device 30 may include a battery 34. The battery 34 may be implemented as a rechargeable battery capable of being recharged. The power supply device 30 may further include a wireless charging module 36 which may charge the battery 34.

The robot 1 may include the output 40. The output 40 may visually or audibly output information to the outside. The output 40 may include a display 42 for visually outputting information. The output 40 may include a speaker 44 for outputting information audibly.

The robot 1 may include the input 50. The input 50 may receive a command for controlling the robot 1. The input 50 may be configured so that a user can directly input commands and the like without the communication module 22. The input 50 may receive a command for controlling the accessory 2.

The input 50 may include a switch 52. The switch 52 may include a power switch for turning the power supply of the robot 1 on and off. The switch 52 may include a function switch for setting the function of the robot 1, pairing with a predetermined network, or pairing with the terminal 6. It may be possible to set various commands to be given to the robot 1 through a combination of the pushing time and/or the number of continuous pushes of the function switch in advance. The switch 52 may include a reset switch that may reset a predetermined setting of the robot 1. The switch 52 may include a sleep switch for switching the robot 1 to a power-saving state or a non-output state.

The input 50 may include a camera 54 for sensing an external visual image. The camera 54 may acquire an image for recognizing the user. The camera 54 may acquire an image for recognizing the direction of the user. The image information acquired by the camera 54 may be stored in the storage unit 24. The input 50 may further include a touch-type display.

The input 50 may include a microphone 56 for sensing an external sound. When the robot 1 is equipped with the microphone 56, the controller 20 of the robot 1 may recognize a voice of the user inputted through the microphone 56 and extract the command. In order to recognize the position of the sound source, the input 50 may include a plurality of microphones 56. The sound information acquired by the microphone 56 or the location information of the user may be stored in the memory 24.

The robot 1 may include a direction sensor for detecting the direction of the user with respect to the robot 1. The direction sensor may comprise a camera 54 and/or a plurality of microphones 56.

The robot 1 may include the drive 60 for performing motions of the robot 1. The robot 1 may perform the motion of the robot 1 together with the output contents of the display 42 or the output contents of the speaker 44 of the robot 1 to imitate a living creature. The motion of the robot 1 by the drive 60 may perform a function of causing the user to effectively recognize the output contents of the output 40 just as gestures (motions) or eye contacts play a big role in communication between humans. The motion of the robot 1 by the drive 60 is for adding emotional elements in the communication process between the user and the robot 1.

The drive 60 may include a plurality of drive units or drives 250 and 350. The plurality of drives 250 and 350 may be independently driven or simultaneously driven to enable complex motion.

The drive 60 may include a spin mechanism 250 for rotating the spin body 200 with respect to the base 100. The spin mechanism 250 may provide power to rotate the spin body 200 about the rotation axis Os extending in the up and down or vertical direction with respect to the base 100. The rotation axis Os may mean a virtual rotation axis.

The drive 60 may further include a tilting mechanism 350 that tilts the tilting body 300 about the tilting shaft OT. The tilting mechanism 350 may provide power such that the tilting body 300 may be tilted to one side with respect to the spin body 200.

The tilting mechanism 350 may provide power to rotate the tilting body 300 about the tilting shaft or axis OT. The tilting mechanism 350 may be connected to the spin body 200 and the tilting mechanism 350 and the tilting body 300 may be rotated together with the spin body 200 when the spin body 200 is rotated by the spin mechanism 250.

The controller 20 may control the communication module 22 based on the control information received from the input 50. The controller 20 may control the communication module 22 to store the information received from the network in the memory 24. The controller 20 may transmit the information stored in the memory 24 via the communication module 22 to the network.

The controller 20 may receive control information from the input 50. The controller 20 may control the output 40 to output predetermined information. The controller 20 may control the drive 60 to operate together with the information output of the output 40.

For example, the controller 20 may recognize who is a user based on the image acquired by the camera 54, and may operate the output 40 and the drive 60 based on the recognition result. If the recognized user matches the preset user, the controller 20 may display a smiling image on the display 42 and activate the tilting mechanism 350 to tilt the tilting body 300 in the up and down direction or the left and right direction. As another example, the controller 20 may recognize the face position of the user based on the direction sensor and operate the output 40 and the drive 60 based on the recognition result.

The controller 20 may display predetermined information on the display 42 and may operate the spin mechanism 250 to operate the display 42 to face the user's face. The controller 20 may control the spin body 200 to be rotated so as to switch the image output direction of the display 42 to the direction of the user detected by the direction sensor.

The controller 20 may control whether or not the drive 60 is operated based on the control information received from the network through the communication module 22. The controller 20 may control the drive 60 based on the control information received from the input 50. The controller 20 may control the drive 60 based on the control information stored in the memory 24.

The robot 1 may include a remote control module. The remote control module may transmit an optical signal (for example, an infrared signal) for controlling a predetermined peripheral device. The predetermined peripheral device may mean a peripheral device which can perform remote control. For example, the predetermined peripheral device may be a washing machine, a refrigerator, an air conditioner, a robot cleaner, a TV, or the like, which may be controlled by a remote controller.

The remote control module may include a light emitting unit for emitting a predetermined optical signal for controlling a predetermined peripheral device. For example, the light emitting portion may be an LED that emits infrared rays. The direction in which the remote control module irradiates the optical signal may be changed according to the operation of the robot 1. The optical signal irradiating direction of the remote control module may be changed in a direction of the specific device requiring the remote control, thereby controlling the specific device with the optical signal.

The display 42, the speaker 44, the camera 54, the microphone 56, and the like, which may constitute the robot 1 may be interfaces for assisting communication between the human and the robot 1, these interfaces may be rotated together with the spin body 200 when the spin body 200 is rotated and can be tilted together with the tilting body 300 by being mounted on the tilting body 300. The robot 1 may be orientated such that the interfaces such as the display 42, the speaker 44, the camera 54, and the microphone 56 are dispersed throughout the spin body 200 and the tilting body 300.

The robot 1 may include interface modules 400 and 410 including at least one of interfaces such as a display 42, a speaker 44, a camera 54, and a microphone 56. The interface modules 400 and 410 may be mounted on the tilting body 300, may be rotated together with the tilting body 300 when the spin body 200 is rotated, and may be tilted together with the tilting body 300 when the tilting body 300 is tilted.

The battery 34, the display 42, the speaker 44, the camera 54, the microphone 56, the spin mechanism 250, the tilting mechanism 350, and the like may be supported to the spin body 200 or the tilting body 300 considering each of the weights and sizes thereof and the robot may be arranged so that the entire center of gravity of the robot can be minimized.

Figure 8:
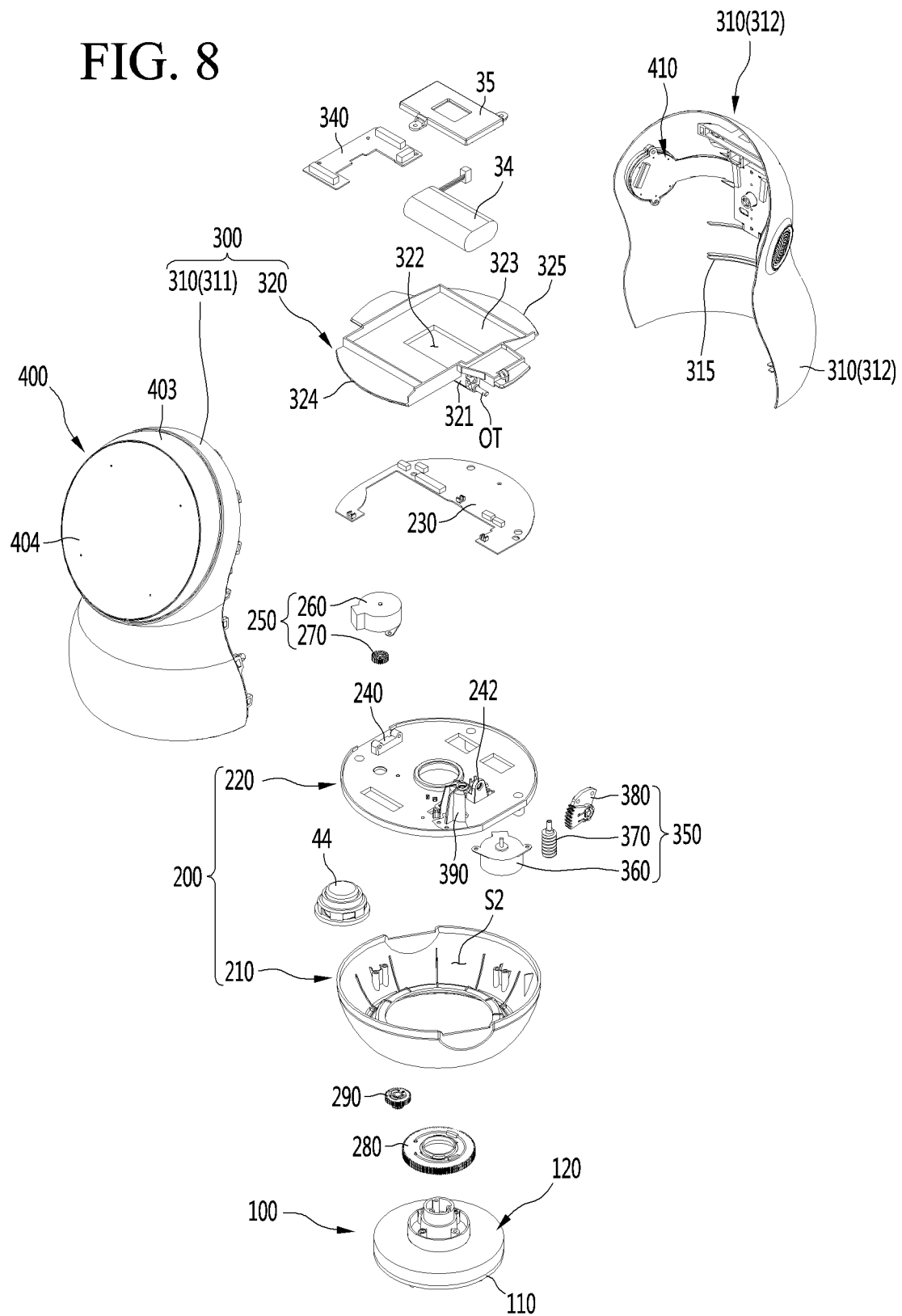
FIG. 8 is an exploded perspective view illustrating the robot according to an embodiment.

According to FIG. 8, the base 100 may support the spin body 100 in a rotatable manner and may support loads of the spin body 200, the tilting body 300, and the interface modules 400 and 410. The base 100 may be composed of a combination of a plurality of members. More specifically, the base 100 may include a base body 110 supporting the entire load of the robot 1, and a spin body connection portion or connector 120 which is fastened to the upper side of the base body 110 and to which the spin body 200 is rotatably connected.

The shape of the base body 110 is not limited and may have a disk shape, for example. In order to stably support the robot 1, the size of the base body 110 may be equal to or greater than the size of the spin body connection portion 120.

The spin body connector 120 may include a fixed shaft 126 (see FIG. 17) having a vertically erected cylindrical shape. The center of the fixed shaft 126 may coincide with the rotation axis OS of the spin body 200. Accordingly, the spin body 200 may be rotatably connected to the fixed shaft 126 and may be rotated about the fixed shaft 126. A more detailed configuration of the base 100 will be described later in detail.

The spin body 200 may include a spin housing 210 having a space S2 formed therein and a spin cover 220 covering the space S2 from above. At least one of the spin housing 210 and the spin cover 220 may be rotatably connected to the base 100.

A predetermined interface may be accommodated in the space S2 inside the spin body 200. For example, the speaker 44 may be accommodated in the space S2 inside the spin body 200. The speaker 44 may be accommodated in the space S2 inside the spin body 200 because it is heavy in weight compared to other components. However, the present disclosure is not limited to this, and it is also possible to accommodate other interfaces such as the microphone 56, the battery 34, the drive PCB 230, or the like in the space S2 inside the spin body 200. The speaker 44 may also be mounted on the tilting body 300.

In addition, a tilting motor 360, which will be described later, may be accommodated in the space S2 inside the spin body 200. In this case, the spin housing 210 and the spin cover 220 may function as a protective cover for protecting the interface and the tilting motor 360, which are accommodated in the space S2.

A portion of the spin housing 210 may be exposed to the outside. A portion of the spin housing 210 may be seen through the lower end of the tilting housing 310, which will be described later, and the spin housing 210 may form a portion of the outer appearance of the communication robot.

The spin housing 210 may have a shape such that the upper surface thereof is opened and the size thereof is reduced toward the lower portion. The outer surface of the spin housing 210 may be convex toward the outside. The upper end diameter of the spin housing 210 may be larger than the lower end diameter of the spin housing 210.

The spin cover 220 may be in the form of a plate as a whole, may be mounted on the upper end of the spin housing 210, and may be inserted into the spin housing 210 to couple with the spin housing 210 inside the spin housing 210. The spin cover 220 may cover the opened upper surface of the spin housing 210. The shape of the spin cover 220 may correspond to the shape of the upper end of the spin housing 210. For example, the spin cover 220 may have a roughly disc shape.

The spin cover 220 may include tilting shaft supporters 240 and 242 for rotatably supporting a tilting shaft OT connected to the tilting body 300. The tilting shaft supporters 240 and 242 may be arranged on the upper surface of the spin cover 220. The pair of tilting shaft supporters 240 and 242 may be spaced apart from each other in the horizontal direction and the tilting shaft OT may be rotatably supported by the tilting shaft supporters 240 and 242.

The robot 1 may further include the spin cover 220, and more particularly, a drive PCB 230 provided on the spin cover 220. The drive PCB 230 may be seated on the upper surface of the spin cover 220. In other words, the drive PCB 230 may be arranged horizontally on the upper surface of the spin cover 220.

The drive PCB 230 may be smaller than the spin cover 220 and may only cover a portion of the upper surface of the spin cover 220. The area of the drive PCB 230 may be less than half the area of the spin cover 220.

The drive PCB 230 may control at least one electrical component mounted on the spin cover 220. For example, the drive PCB 230 may control a spin motor 260 and a tilting motor 360 by being electrically connected to the spin motor 260 and the tilting motor 360, which may be provided on the spin body 200.

Since the spin motor 260, the tilting motor 360, and the drive PCB 230 may each be mounted on the spin body 200, when the spin body 200 is rotated, the spin motor 260, the tilting motor 360, and the drive PCB 230 all rotate collectively about the rotation axis OS of the spin body 200. Therefore, relative movement does not occur between the spin motor 260, the tilting motor 360, and the drive PCB 230, and tangling and twisting of a connection member connecting the drive PCB 230 and the respective motors 260 and 360 may not occur.

The spin mechanism 250 may rotate the spin body 200 with respect to the base 100. The spin mechanism 250 may include a spin motor 260, a spin drive gear 270, and a spin driven gear 280. The spin mechanism 250 may further include a spin intermediate gear 290. The spin motor 260 may provide power to rotate the spin body 200 relative to the base 100.

The spin motor 260 may be provided on the spin cover 220. More specifically, the spin motor 260 may be provided on an upper surface of the spin cover 220. The drive shaft of the spin motor 260 may protrude vertically below the spin motor 260. The drive shaft of the spin motor 260 may protrude toward the space S2 inside the spin body 200.

The spin motor 260 may be provided between the spin cover 220 and a tilting base 320 described later. In other words, the spin motor 260 may be positioned between the upper surface of the spin cover 220 and a lower surface of the tilting base 320. The spin motor 260 may be protected by the spin cover 220 and the tilting base 320.

The spin drive gear 270 may be connected to the drive shaft of the spin motor 260 in the space S2 inside the spin body 200. The spin drive gear 270 may be rotated inside the spin body 200 and may be protected by the spin body 200. The spin drive gear 270 may hang on the drive shaft of the spin motor 260. The spin drive gear 270 may be rotated by the spin motor 260 under a lower surface of the spin cover 220.

The spin driven gear 280 may be fixed to the base 100. The spin driven gear 280 may be a fixed gear which is fixedly mounted on the spin body connector 120 of the base 100. The spin mechanism 250 may mesh the spin drive gear 270 with the spin driven gear 280. In this case, the spin drive gear 270 may be rotated while revolving around the outer circumference of the spin driven gear 280.

The spin mechanism 250 may be configured such that the spin drive gear 270 is not directly engaged with the spin driven gear 280 but the spin drive gear 270 and the spin driven gear 280 are connected through at least one spin intermediate gear 290. The spin intermediate gear 290 may be rotatably connected to the spin cover 220. The intermediate gear 280 may be positioned below the lower surface of the spin cover 220. In other words, the spin intermediate gear 290 may be accommodated in the space S2 of the spin body 200, like the spin drive gear 270.

The spin intermediate gear 290 may transmit power between the spin drive gear 270 and the spin driven gear 280. The spin intermediate gear 290 may be rotated while revolving around the outer circumference of the spin driven gear 280.

The tilting body 300 may include a tilting housing 310 and a tilting base 320. The tilting housing 310 may form an outer appearance of the robot 1 and may be larger than the spin housing 210. Accordingly, the tilting housing 310 may be referred to as an outer case.

A lower surface of the tilting housing 310 may be opened and an upper space S3 (see FIG. 18) may be formed therein. The tilting base 320 may be accommodated in the upper space S3 of the tilting housing 310. The tilting housing 310 may cover at least a portion of the outer circumference of the spin body 200. More specifically, the spin cover 220 may be positioned inside the tilting housing 310, and the lower inner surface of the tilting housing 310 may face the outer circumferential surface of the spin housing 210.

The tilting housing 310 may be composed of a combination of a plurality of members, and a plurality of housings that are positioned back and forth, left and right may be coupled to each other. For example, the tilting housing 310 may include a first tilting housing 311 and a second tilting housing 312 coupled to the first tilting housing 311, and an upper space S3 may be formed between the first tilting housings 311 and the second tilting housings 312. The first tilting housing 311 and the second tilting housing 312 may be coupled to the tilting base 320, respectively.

In a case where the first tilting housing 311 is a front tilting housing, the second tilting housing 312 may be a rear tilting housing coupled to the rear end of the first tilting housing 311, and in a case where the first tilting housing 311 is a left tilting housing, the second tilting housing 312 may be a right tilting housing coupled to the right end of the first tilting housing 311. At least one interface module 400, 410 may be provided in the tilting housing 310. For example, a first interface module 400 including the display 42 may be mounted on the first tilting housing 311, and a second interface module 410 including the microphone 56 may be mounted on the second tilting housing 312.

The interface modules 400 and 410 may be positioned above the tilting base 320. The tilting base 320 may be protected by the tilting housing 310 by being accommodated in the upper space S3 of the tilting housing 310. The tilting base 320 may be connected to the tilting shaft OT and rotated together with the tilting shaft OT. The tilting base 320 may include a tilting shaft connection portion or connector 321 to which a tilting shaft OT is connected. The tilting shaft connection portion 321 may be formed at a lower portion of the tilting base 320. The tilting shaft OT may extend in the horizontal direction and may be connected to the tilting shaft connection portion 321.

The tilting shaft OT may be connected to the tilting base 320 and the tilting base 320 may be coupled to the tilting housing 310. When the tilting shaft OT is rotated, the tilting base 320 and the tilting housing 310 may be tilted while being rotated together around the tilting shaft OT.

The inner surface of the tilting housing 310 may include tilting base coupling portions or couplers 314 and 315 to which the tilting base 320 is coupled. The tilting base 320 may include coupling portions or tabs 324 and 325 to be coupled with the tilting base coupling portions 314 and 315, respectively.

The robot 1 may further include an intermediate PCB 340 provided on the tilting base 320. The intermediate PCB 340 may be seated on the upper surface of the tilting base 320. The intermediate PCB 340 may be placed horizontally on the upper surface of the tilting base 320.

The tilting base 320 may include a PCB mounting portion 323 on which the intermediate PCB 340 is mounted. The PCB mounting portion 323 may be formed on the upper surface of the tilting base 320. The intermediate PCB 340 may be smaller in size than the tilting base 320 and may cover a portion of the upper surface of the tilting base 320. The area of the intermediate PCB 340 may be less than half of the upper surface area of the tilting base 320.

The intermediate PCB 340 may be electrically connected to the PCBs 406 and 416 (see FIGS. 9 and 10) and the drive PCB 230 provided in the interface modules 400 and 410, respectively. More specifically, the PCBs 406 and 416 and the drive PCB 230 may not be directly connected to each other but may be electrically connected through the intermediate PCB 340 provided on the tilting base 320. In other words, the intermediate PCB 340 may function as a relay device for the PCBs 406 and 416 and the drive PCB 230. Accordingly, the length of the connection member such as an electric wire connected to each PCB may be relatively shortened, and the phenomenon of tangling or twisting of the connection member when the robot 1 is rotated and/or tilted may be minimized. This will be described in detail later.

A battery 34 may be mounted on the tilting base 320. In other words, a battery mounting portion (or battery mount) 322 on which the battery 34 is mounted may be formed on the tilting base 320. The battery mounting portion 322 may be formed on the upper surface of the tilting base 320. The battery mounting portion 322 may be a pocket into which the battery 34 can be inserted and accommodated. A battery cover 35 may be coupled to the tilting base 320 to prevent the battery 34 accommodated in the battery mounting portion 322 from being removed arbitrarily.

The tilting mechanism 350 may include a tilting motor 360, a tilting drive gear 370 whose lower portion or end is connected to the tilting motor 360, and a tilting driven gear 380 which is connected to the tilting shaft OT or the tilting body 300 and receives an input from the tilting drive gear 370. The tilting motor 360 may provide power to tilt the tilting body 300 about the tilting shaft OT.

One of the spin motor 260 and the tilting motor 360 may be provided on the lower surface of the spin cover 220 and the other may be provided on the upper surface of the spin cover 220. In other words, the tilting motor 360 and the tilting driven gear 380 may be positioned opposite to each other with respect to the spin cover 220. Thus, the area of the spin cover 220 may be used efficiently.

For example, the tilting motor 360 may be provided below the spin cover 220, and the tilting driven gear 380 may be positioned above the spin cover 220. The power of the tilting motor 360 may be transmitted to the tilting driven gear 380 through the tilting drive gear 370.

The tilting drive gear 370 may be connected to the tilting motor 360 and rotated. The tilting drive gear 370 may be a worm gear vertically orientated. The tilting drive gear 370 may be provided vertically on the upper side of the spin cover 220 so as to be connected to the tilting motor 360.

A lower rotation shaft including the lower end of the tilting drive gear 370 may be connected to the tilting motor 360 and an upper rotation shaft including the upper end of the tilting drive gear 370 may be rotatably supported by a gear supporter 390 which is described later. The tilting driven gear 380 may be positioned above the spin cover 220 and connected to at least one of the tilting shaft OT and the tilting body 300.

The tilting driven gear 380 may be a spur gear which may be rotated about the tilting shaft OT. The tilting driven gear 380 may be connected to at least one of the tilting shaft OT and the tilting base 320 to tilt the tilting body 300.

The robot 1 may further include a gear supporter 390 to which the tilting drive gear 370 is rotatably connected. The gear supporter 390 may be mounted on the spin cover 220 and may rotatably support the tilting drive gear 360. The gear supporter 390 may be connected to an upper portion of the tilting drive gear 370.

Figure 9:
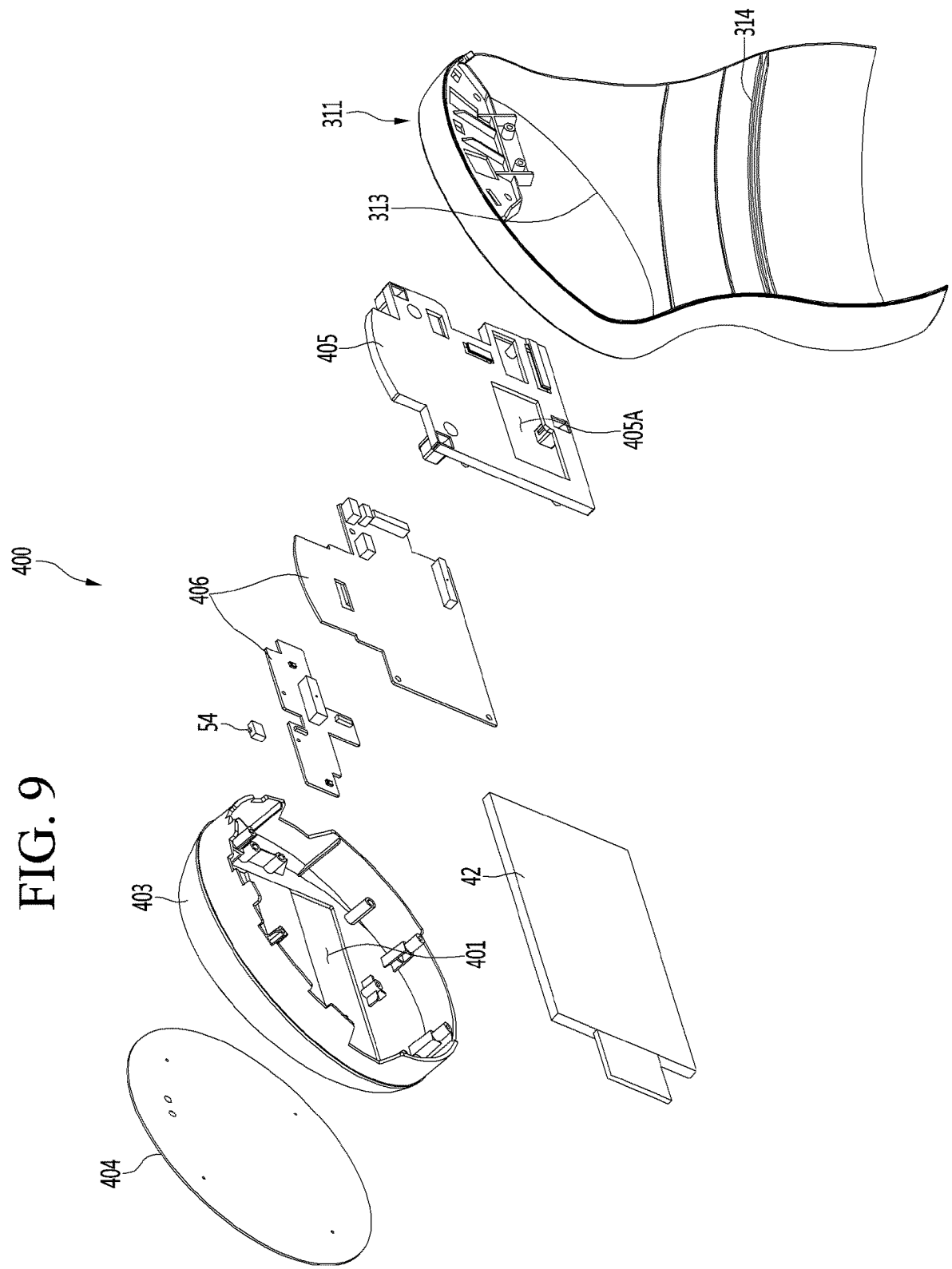
FIG. 9 is an exploded perspective view illustrating a first tilting housing and a first interface module according to an embodiment.
Figure 10:
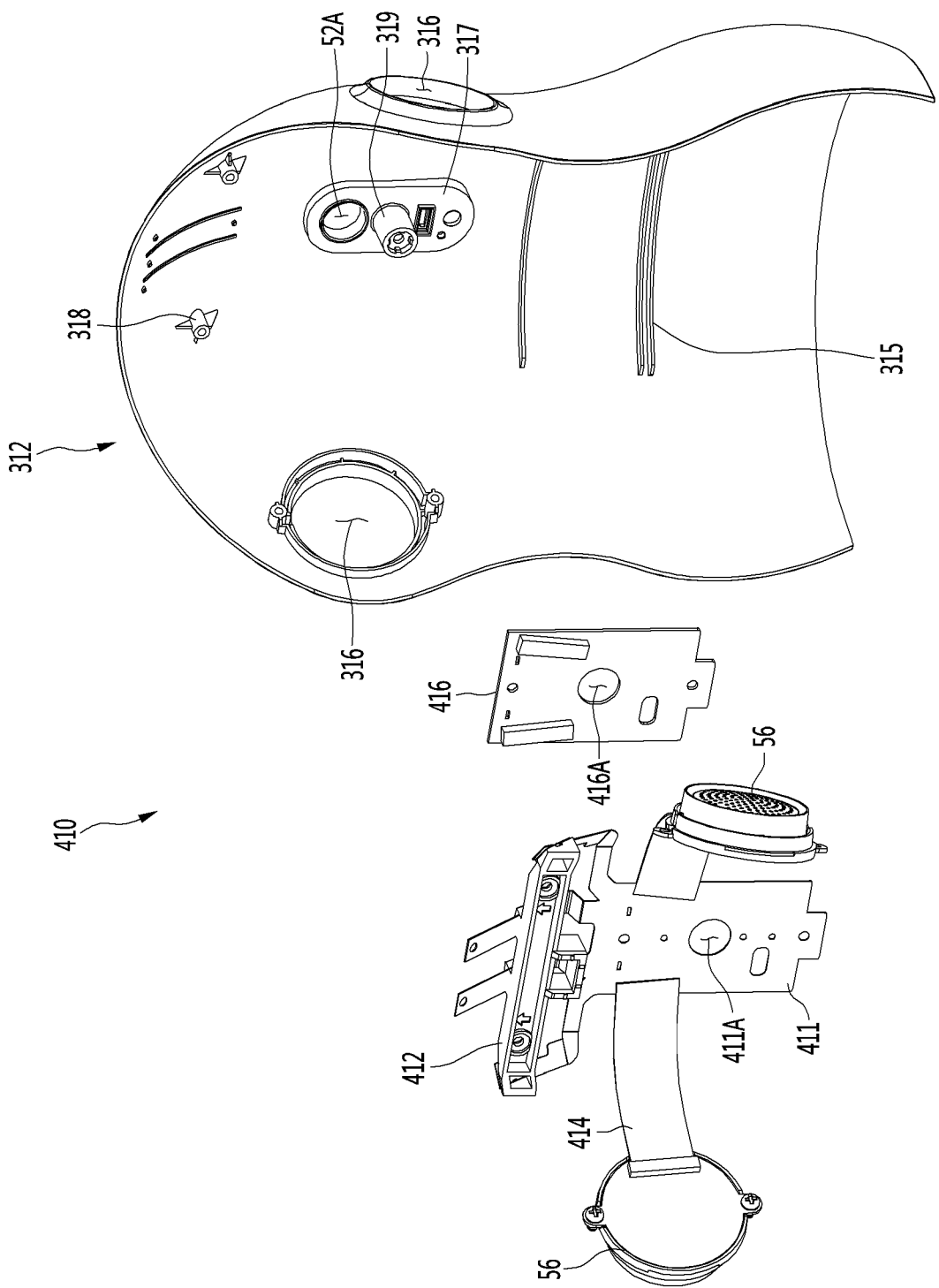
FIG. 10 is an exploded perspective view illustrating a second tilting housing and a second interface module according to an embodiment.
Figure 11:
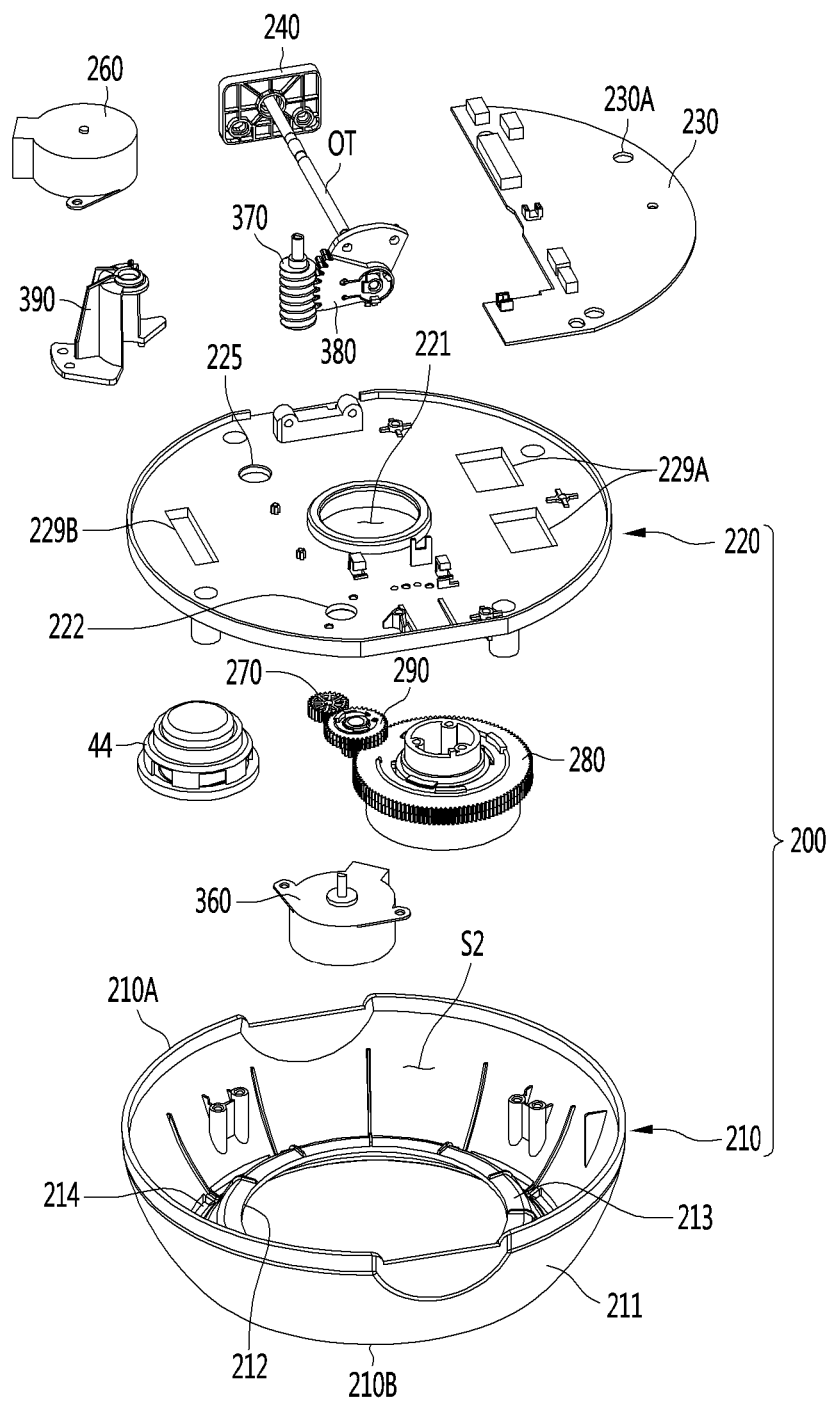
FIG. 11 is an exploded perspective view illustrating a spin body according to an embodiment and components provided in the spin body.
Figure 12:
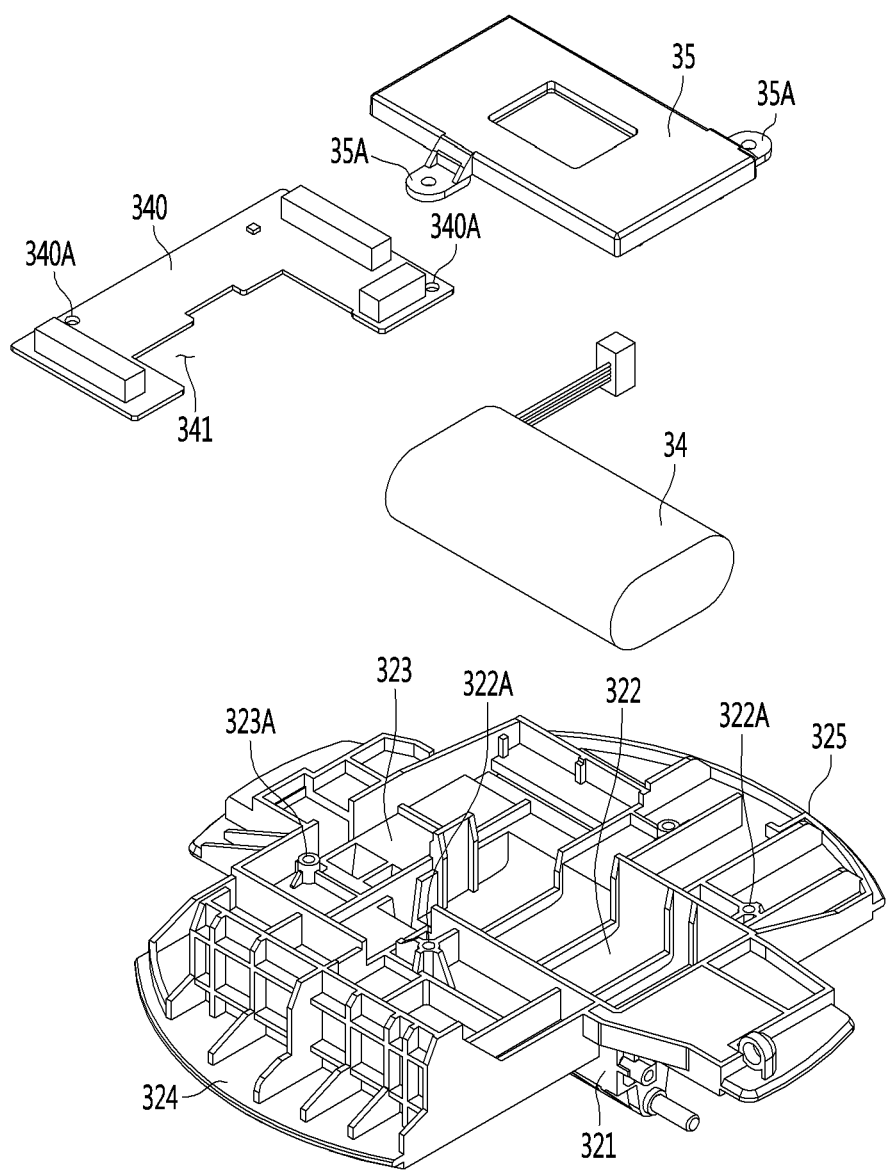
FIG. 12 is an exploded perspective view illustrating a tilting base and components provided on the tilting base according to an embodiment.
Figure 13:
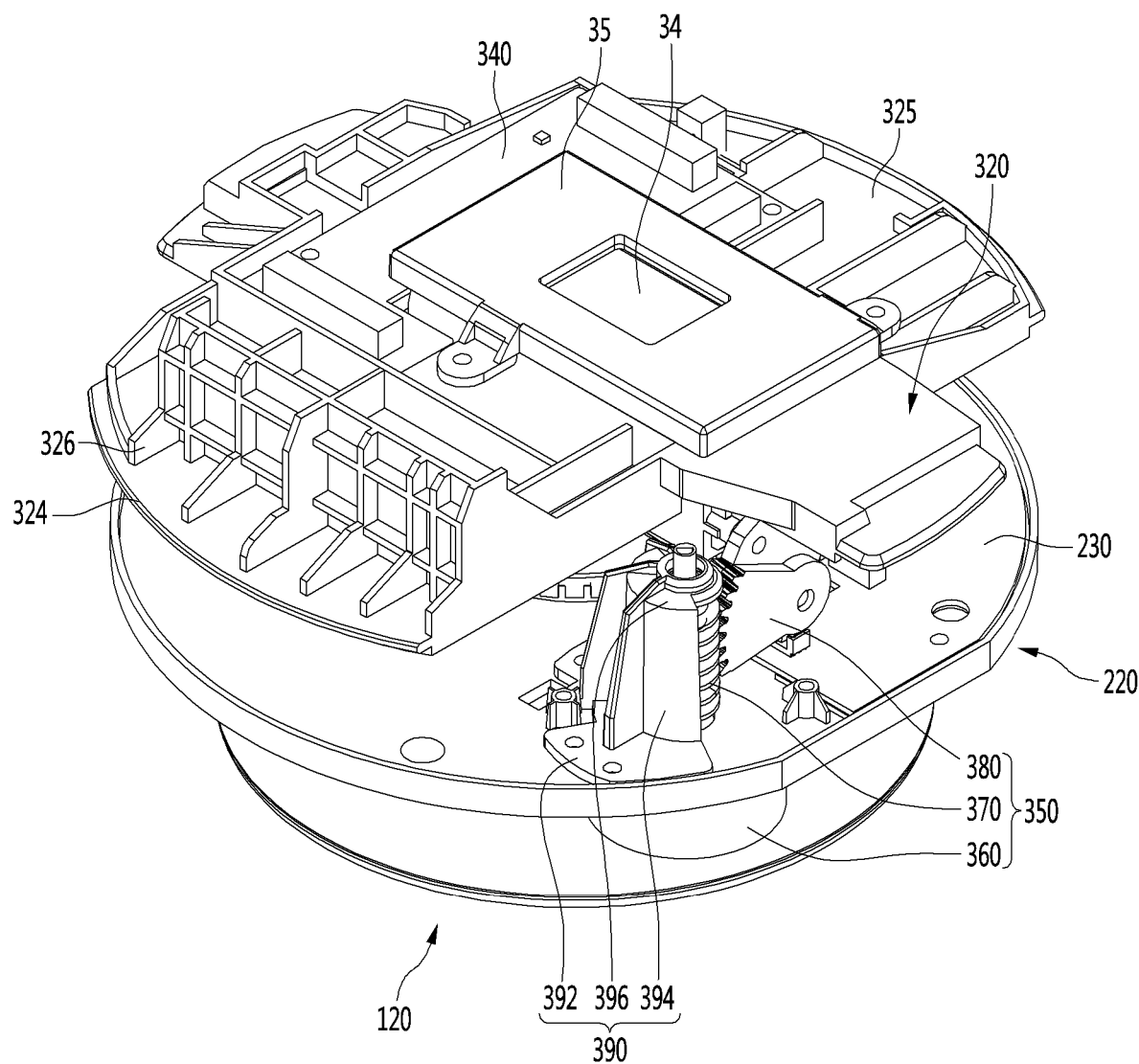
FIG. 13 is a perspective view illustrating a base, a spin cover, a tilting mechanism, and the tilting base according to an embodiment.
Figure 14:
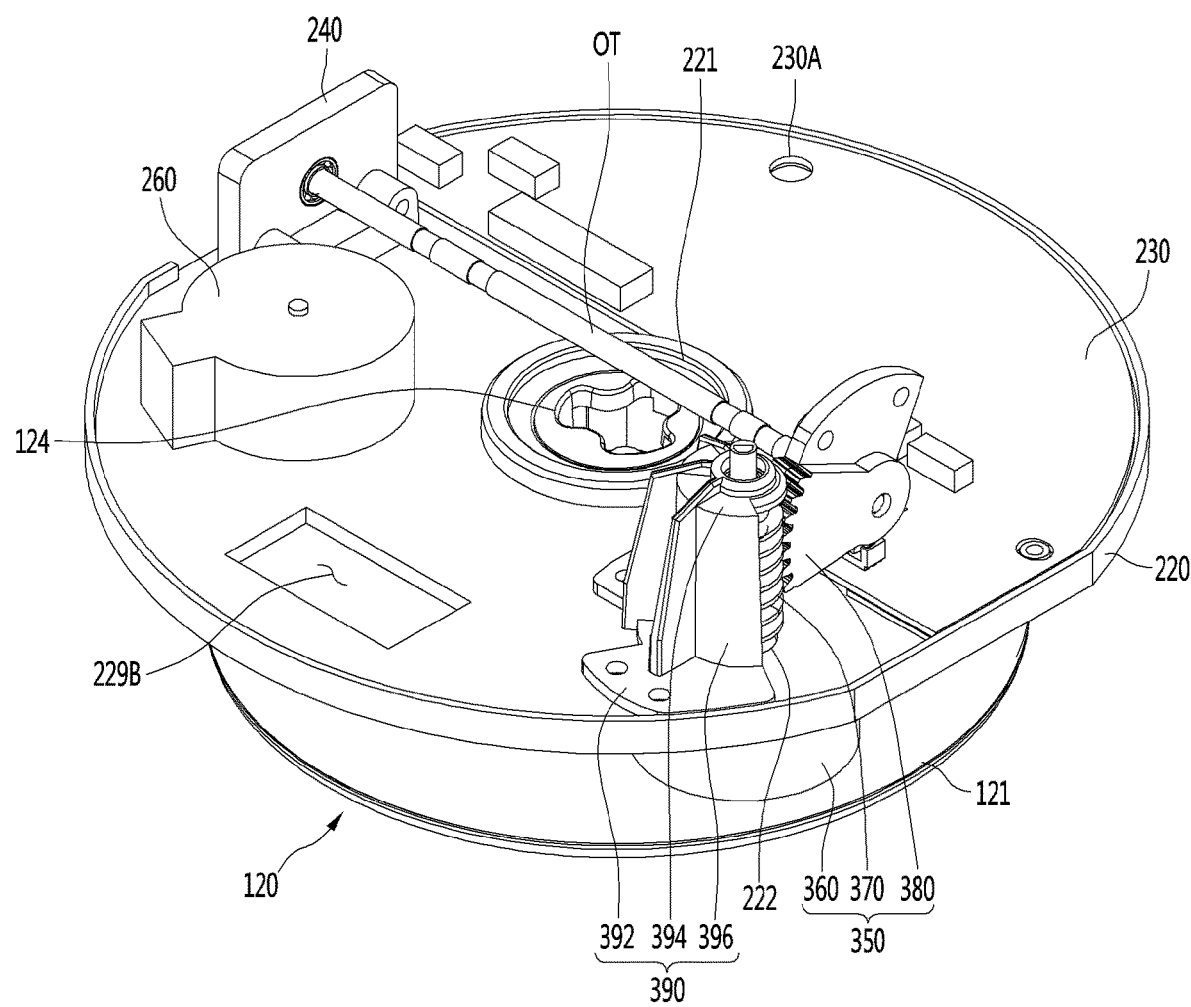
FIG. 14 is an exploded perspective view illustrating the tilting base illustrated in FIG. 13.
Figure 15:
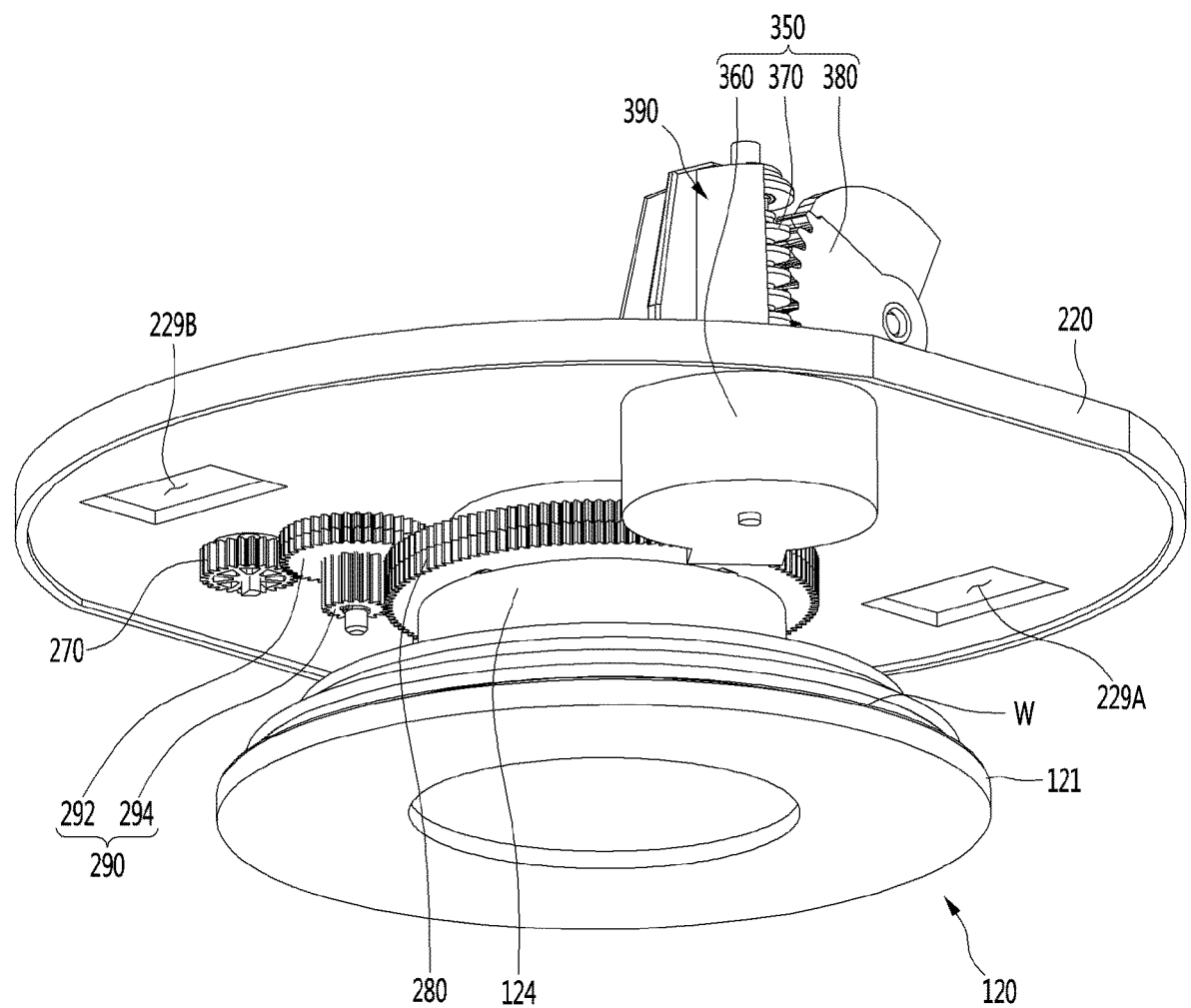
FIG. 15 is a bottom perspective view illustrating the base, the spin cover, the spin mechanism, and the tilting mechanism according to an embodiment.

According to FIGS. 9 and 10, as described above, the tilting housing 310 may include a first tilting housing 311 and a second tilting housing 312. At least one interface module 400, 410 may be mounted on the tilting housing 310 and the robot 1 may further include PCBs 406 and 416 provided in the interface modules 400 and 410.

Hereinafter, a case where the first interface module 400 is mounted on the first tilting housing 311 and the second interface module 410 is mounted on the second tilting housing 312 will be described. With reference to FIG. 9, the first interface module 400 may be mounted on the first tilting housing 311. The first tilting housing 311 may be a front housing mainly facing the user to communicate with the user.

The first tilting housing 311 may have an opening portion (or opening) 313 in which the first interface module 400 is provided. The first interface module 400 may be inserted into the opening 313 and positioned in the opening 313.

The opening 313 may have a shape corresponding to the first interface module 400. For example, the opening 313 may be circular. The opening 313 may be formed so as to penetrate forward. In this case, the front may include both the front upper side and the front lower side.

The first interface module 400 may include an interface case 403 mounted on the first tilting housing 311, at least one interface 42, 54 provided in the interface case 403, a front cover 404 covering the front surface of the interface case 403, and a back cover 405 coupled to the interface case 403. The interface case 403 may have an opened rear surface and at least one opening hole 401 may be formed in the front surface thereof. The interface case 403 may have a shape corresponding to the opening portion 313 formed in the first tilting housing 311 and may be inserted into the opening portion 313 and mounted.

The first interface module 400 may include interfaces 42 and 54 which visually interact with the user. For example, the first interface module 400 may include a display 42 and a camera 54.

A first opening hole 401 in which the display 42 is provided and a second opening hole in which the camera 54 is provided may be formed on the front surface of the interface case 403. At least a portion of the display 42 may be exposed forward of the interface case 403 through the first opening hole 401 and at least a portion of the camera 54 may be exposed forward of the interface case 403 through the second opening hole.

The front cover 404 may cover the front surface of the interface case 404. At least a portion of the front cover 404 may be formed of a transparent or a semitransparent material. More specifically, the portion of the front cover 404 corresponding to the opening hole 401 formed on the interface case 403 may be formed of a transparent or a semitransparent material. Thereby, the image displayed on the display 42 may be delivered to the user, and the camera 54 may take the image.

The back cover 405 may be provided inside the interface case 403 and can be fastened to the interface case 403. The back cover 405 may be arranged behind the interfaces 42 and 54. More specifically, the interfaces 42 and 54 may be mounted on a front of the back cover 405 and may be protected between the front cover 404 and the back cover 405.

The first interface module 400 may include a first interface PCB 406 for controlling the interfaces 42 and 54. A plurality of the first interface PCB 406 may be provided. For example, the first interface PCB 406 may include a PCB for controlling the camera 54 and a PCB for controlling the display 42. The display 42 may be arranged between the first interface PCB 406 and the front cover 404.

The first interface PCB 406 may be mounted on the back cover 405. In other words, the back cover 405 may function as a PCB bracket. The first interface PCB 406 may be protected between the back cover 405 and the front cover 404. The first interface PCB 406 may be disposed vertically or obliquely.

The first interface PCB 406 may be electrically coupled to the intermediate PCB 340 (see FIG. 8). For example, the first interface PCB 406 and the intermediate PCB 340 may be connected by a connection member C1 (see FIG. 18) such as an electric wire. The connection member C1 may electrically connect the first interface PCB 406 and the intermediate PCB 340.

In this case, the back cover 405 may include a through-hole 405A through which the connection member C1 connecting the first interface PCB 406 and the intermediate PCB 340 passes. However, the present disclosure is not limited thereto, and the first interface PCB 406 may be connected to a second interface PCB 416 which is described later, and the second interface PCB 416 may be connected to the intermediate PCB 340.

With reference to FIG. 10, the second interface module 410 may be mounted on the second tilting housing 312. The second tilting housing 312 may be a rear housing fastened to the rear of the first tilting housing 311.

The second interface module 410 may include an interface 56, a PCB bracket 411 on which the second interface PCB 416 is mounted, a housing fastening unit or bracket 412 which is connected to the PCB bracket 411 and fastened to the second tilting housing 312, and a connection substrate 414 which connects between the interface 56 and the second interface PCB 416. The second interface module 410 may include a second interface PCB 416 for controlling the interface 56.

For example, the interface included in the second interface module 410 may be the microphone 56. A pair of microphones 56 may be provided and a pair of sub opening portions or holes 316 may be formed in the second tilting housing 312. Each sub opening hole 316 on which the microphones 56 are mounted may be formed to pass through in the left and right direction. More specifically, one sub-opening hole 316 may be formed in the left portion of the second tilting housing 312 and the other sub opening hole 316 may be formed in the right portion of the second tilting housing 312. By arranging the microphone 56 at a position similar to that of the human ear, the outer appearance of the robot 1 may be designed similar to that of a human, and the user may feel more intimacy with the robot 1.

The second interface PCB 416 may be mounted on the PCB bracket 411. More specifically, the second interface PCB 416 may be mounted on the back surface of the PCB bracket 411. The second interface PCB 416 may be arranged vertically. The PCB bracket 411 may be mounted inside the second tilting housing 312. The PCB bracket 411 may have the shape of a vertically arranged plate.

More specifically, a bracket mounting portion (or bracket mount) 317 on which the PCB bracket 411 is mounted may be formed on the inner surface of the second tilting housing 312. The bracket mount 317 may protrude from the inner surface of the second tilting housing 312 toward the space between the pair of sub opening holes 316. The bracket mount 317 may protrude forward from the inner surface of the rear side of the second tilting housing 312.

The second interface PCB 416 may be positioned between the PCB bracket 411 and the second tilting housing 312 and may be protected by the PCB bracket 411 and the second tilting housing 312. More specifically, the second interface PCB 416 may be fastened to the rear surface of the PCB bracket 411, and the assembly of the PCB bracket 411 and the second interface PCB 416 may be fastened to the bracket mount 317 at the front of the bracket mounting portion 317.

The bracket mount 317 may include a protrusion portion (or protrusion) 319 formed therein. The protrusion 319 may protrude forward from the front surface of the bracket mount 317. The bracket mount 317 may penetrate the second interface PCB 416 and the PCB bracket 411. More specifically, a first fixing hole 411A may be formed in the PCB bracket 411, a second fixing hole 416A may be formed in the second interface PCB 416, and the protrusion 319 may pass through the first fixing hole 411A and the second fixing hole 416A to fix the PCB bracket 411 and the second interface PCB 416. The PCB bracket 411 and the second interface PCB 416 may be positioned such that the first fixing hole 411A and the second fixing hole 416A correspond to each other in the front and rear or horizontal direction.

The housing fastening bracket 412 may be connected to the PCB bracket 411 and fastened to the inner surface of the second tilting housing 312. Accordingly, the fastening of the second interface module 410 and the second tilting housing 312 may be further strengthened.

The housing fastening bracket 412 may have a bar shape that is long in the horizontal direction, and at least one fastening hole may be formed. In addition, at least one fastening boss 318 fastened to the housing fastening bracket 412 may be formed on the inner surface of the second tilting housing 312. Each fastening boss 318 may correspond to a fastening hole formed in the housing fastening bracket 412 and a separate fastening member such as a screw may be fastened to the fastening boss 318 through the fastening hole of the housing fastening bracket 412.

The connection substrate 414 may connect the second interface PCB 416 and the microphone 56 so that the second interface PCB 416 and the microphone 56 may be electrically connected. The connection substrate 414 may be a flexible substrate.

A first end of the connection substrate 414 may be fixed to the microphone 56 and a second end thereof may be fixed to the PCB bracket 411. The second interface PCB 416 may be connected to the second end of the connection substrate 414 when the second interface PCB 416 is mounted on the PCB bracket 411. However, an electric wire may be used instead of the connecting board 414.

The second interface PCB 416 may be connected to a switch 52 (see FIGS. 5 to 7) to receive an input signal of the switch 52. The second tilting housing 312 may include a switch mounting hole 52A through which the switch 52 may be accommodated. More specifically, the switch mounting hole 52A may be formed through the bracket mount 317. The switch mounting hole 52A may pass through in the front and rear or horizontal direction, but the description is not limited thereto. In addition, the second interface PCB 416 may be electrically connected to at least one of the first interface PCB 406 and the intermediate PCB 340 (see FIG. 8) through a connection member such as an electric wire or a connection substrate.

Referring to FIGS. 11-15, as described above, the spin body 200 may include a spin housing 210 in which a space S2 is formed and a spin cover 220 which covers the space S2. The interface may be accommodated in the space S2 inside the spin body 200. The space S2 formed inside the spin body 200 may accommodate both the interface (for example, speaker 44) and the tilting motor 360 together, and the spin housing 210 and the spin cover 220 may serve as a protective cover to protect the interface and the tilting motor 360 accommodated in the space S2.

The spin housing 210 may have a shape in which the upper surface is opened and the diameter decreases toward the lower portion. The outer surface of the spin housing 210 may be convex toward the outside. The outer diameter of the upper end 210A of the spin housing 210 may be larger than the outer diameter of the lower end 210B of the spin housing 210.

The spin housing 210 may include an upper hollow body 211. The upper hollow body 211 may have a space S2 in which the tilting motor 360 and the interface 44 may be accommodated therein, and the diameter may decrease toward the lower portion. The spin housing 210 may further include a lower hollow body 213. The lower hollow body 213 may extend from the lower end of the upper hollow body 211 toward the space S2 formed in the upper hollow body 211.

A base through-hole 212 through which a portion of the base 100 passes may be formed at the center of the lower hollow body 213. The base through-hole 212 may be formed in the lower hollow body 213 in a vertically penetrating manner.

The spin housing 210 may include a sound hole 214 through which sound generated from the speaker 44 may exit the spin body 200. The sound hole 214 may be formed between the upper hollow body 211 and the lower hollow body 213. A plurality of sound holes 214 may be formed in the spin housing 210 and a plurality of sound holes 214 may be spaced from each other in the circumferential direction of the spin housing 210. More specifically, the spin housing 210 may include a plurality of bridges connecting the upper hollow body 211 and the lower hollow body 213, and the sound holes 214 may be formed between the adjacent bridges in the circumferential direction.

Figure 5:
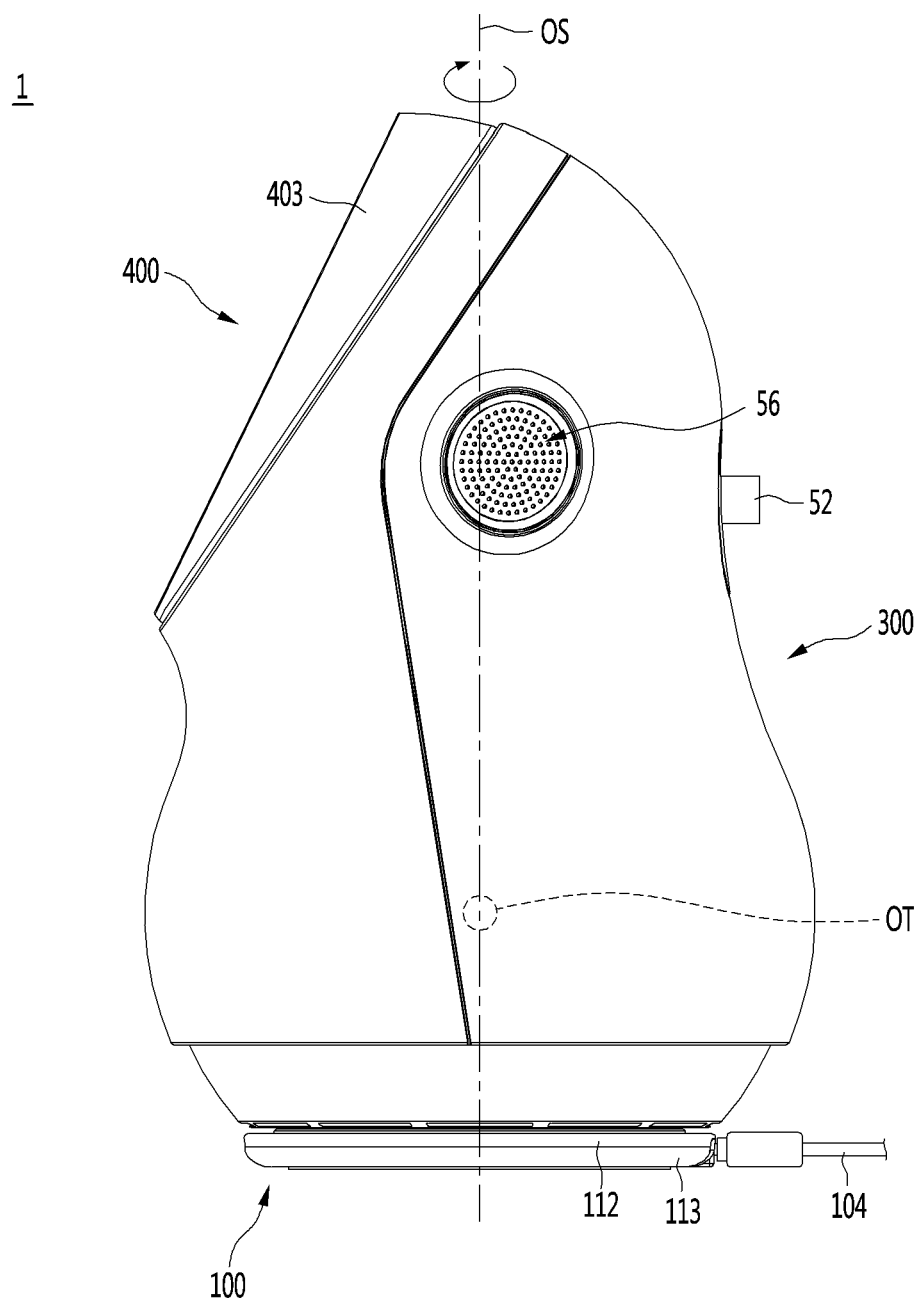
FIG. 5 is a front view illustrating when a rotation body of the robot according to an embodiment is rotated in one direction.
Figure 6:
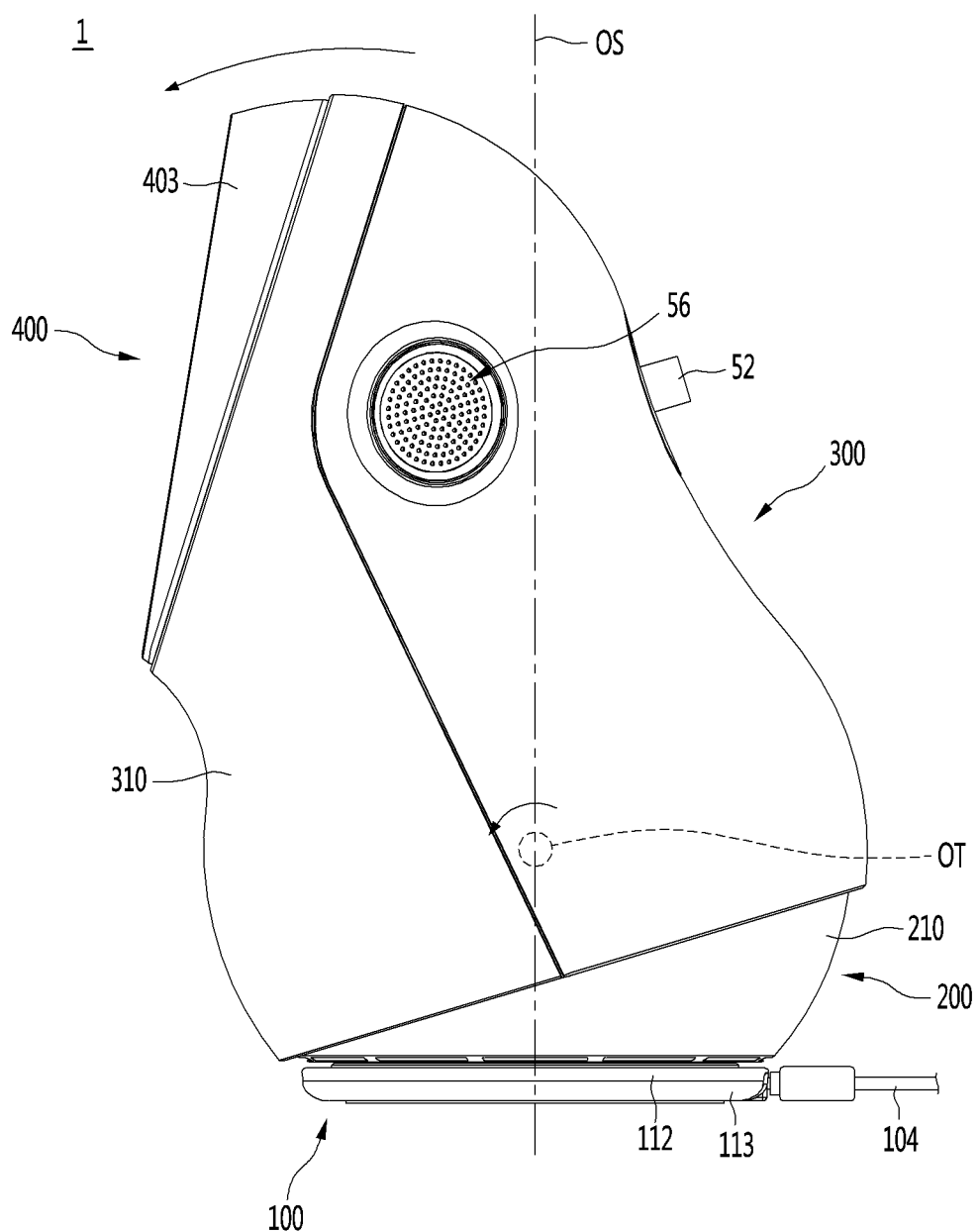
FIG. 6 is a side view illustrating when the tilting body of the robot according to an embodiment is tilted forward.
Figure 7:
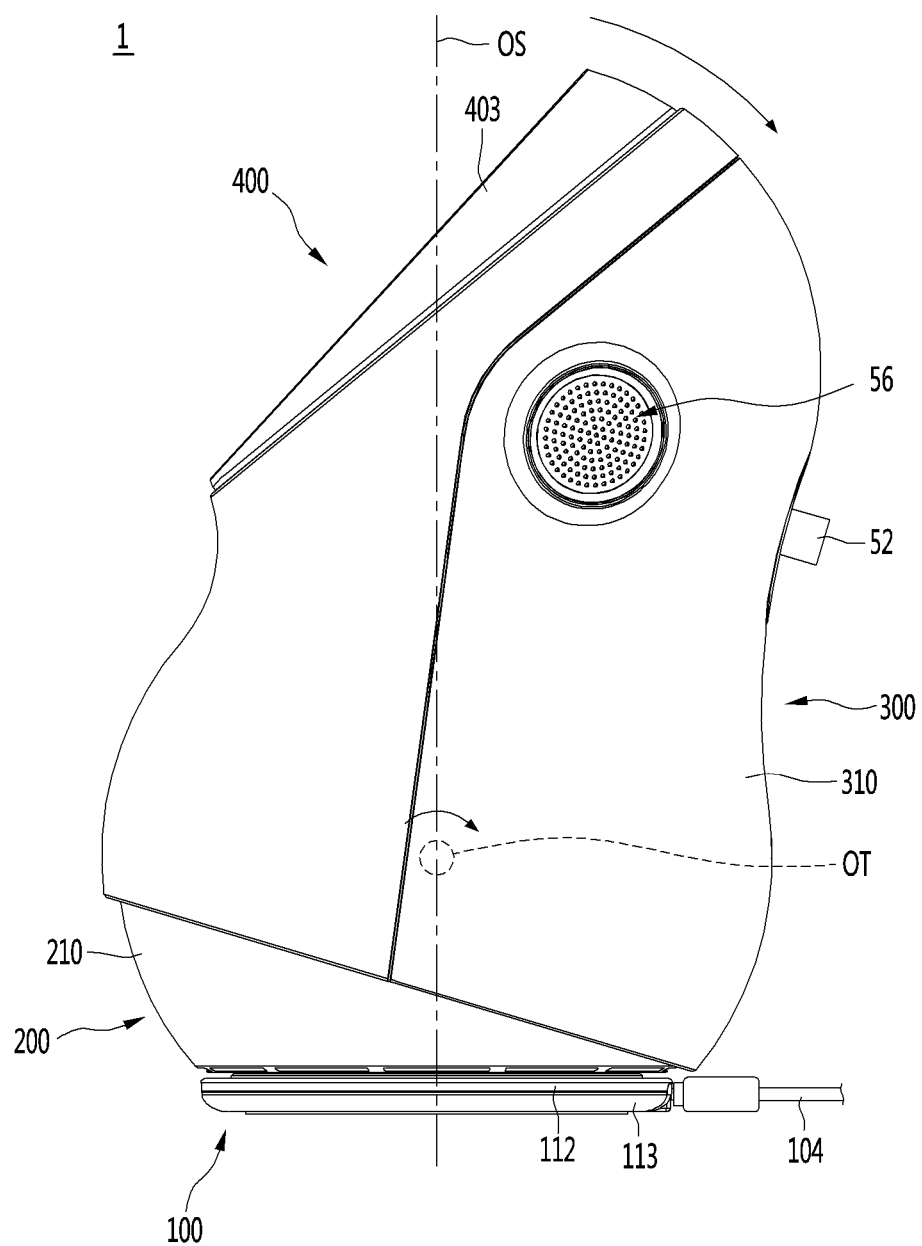
FIG. 7 is a side view illustrating when the tilting body of the robot according to an embodiment is tilted rearward.

The spin cover 220 may include a fixed shaft connection portion (or hole) 221 to which a fixed shaft 126 (see FIG. 17) to be described later is connected. The fixed shaft connection hole 221 may be formed at the center portion of the spin cover 220. The fixed shaft connection hole 221 may penetrate the spin cover 220 vertically and may be formed in a circular shape. The fixed shaft connection hole may include a fixed shaft connection bracket to which the fixed shaft 126 may be connected. The fixed shaft connection hole 221 may be rotatably mounted with the fixed shaft 126 of the base 100 inserted therein. The virtual vertical center axis of the fixed shaft connection portion 221 may coincide with the virtual rotational axis OS of the spin body 200 (FIGS. 5 to 7).

The drive PCB 230 may be seated on the upper surface of the spin cover 220. More specifically, the drive PCB 230 may be eccentrically provided on one side of the upper surface of the spin cover 220. The spin motor 260, the tilting drive gear 370, the tilting driven gear 380, the gear supporter 390, and the like may be provided on the upper surface of the spin cover 220, and the drive PCB 230 may be eccentrically arranged at a position not interfering with the spin motor 260, the tilting drive gear 370, the tilting driven gear 380, the gear supporter 390, and the like.

At least one fastening hole 230A may be formed in the drive PCB 230 and a fastening member such as a screw, for example, may penetrate the fastening hole 230A formed in the drive PCB 230 to form the spin cover 220. The drive PCB 230 may be disposed horizontally. The upper surface of the drive PCB 230 may face the lower surface of the tilting base 320. The drive PCB 230 may be protected by the spin cover 220 and the tilting base 320.

The drive PCB 230 provided on the upper surface of the spin cover 220 and the tilting motor 360 accommodated in the space S2 may be electrically connected by a connection member such as an electric wire, for example. The spin cover 220 may include at least one first through-hole 229A through which a connection member connecting the drive PCB 230 and the tilting motor 360 passes. The first through-hole 229A may be formed below the drive PCB 230 and may be covered by the drive PCB 230.

The drive PCB 230 provided on the upper surface of the spin cover 220 and the interface 44 accommodated in the space S2 may be electrically connected to the spin cover 220 by a connection member such as an electric wire, for example. The spin cover 220 may include at least one second through-hole 229B through which a connection member connecting the drive PCB 230 and the interface 44 passes. The second through-hole 229B may be formed at a position spaced apart from the first through-hole 229A and may not be covered by the drive PCB 230. The second through-hole 229B may not be separately formed in the spin cover 220 and the connection member connecting the drive PCB 230 and the interface 44 may pass through the first through-hole 229A.

The spin cover 220 may include tilting shaft supporters 240 and 248 (see FIG. 8) for rotatably supporting the tilting shaft OT. The tilting shaft supporters 240 and 242 may be provided on the upper surface of the tilting cover 220. A pair of tilting shaft supporters 240 and 242 may be spaced apart in the horizontal direction and the tilting shaft OT may be rotatably supported by the tilting shaft supporters 240 and 242.

The spin mechanism 250 may include the spin motor 260, the spin drive gear 270, the spin driven gear 280, and may further include the spin intermediate gear 290. The spin motor 260 may be fastened to the spin cover 220 by fastening members such as screws, for example. The spin cover 220 may include a fastening boss or a fastening hole on which the spin motor 260 is mounted.

The spin motor 260 may be provided between the outer circumference of the spin cover 220 and the fixed shaft connection portion 221 with respect to the radial direction of the spin cover 220. In other words, the spin motor 260 may be provided at a position eccentric to the rotation axis (OS, see FIGS. 5 to 7) of the spin body. When the spin body 200 is rotated, the spin motor 260 may revolve about the rotation axis OS of the spin body 200.

The spin motor 260 may be arranged on the spin cover 220 and the drive shaft may protrude below the spin motor 220. The spin motor 260 may be provided between the spin cover 220 and the tilting base 320, and the spin motor 260 may be protected by the spin cover 220 and the tilting base 320. More specifically, the spin motor 260 may be provided on the upper surface of the spin cover 220. The drive shaft of the spin motor 260 may extend vertically below the spin motor 260. The drive shaft of the spin motor 260 may protrude toward the space S2 inside the spin body 200.

The spin driving gear 270 may be provided in the space S2 inside the spin body 200 and may be connected to the driving shaft of the spin motor 260. The spin drive gear 270 may be suspended from the drive shaft of the spin motor 260. The spin drive gear 270 and the spin motor 260 may be positioned opposite to each other with respect to the spin cover 220.

A first through-hole 225 through which at least one of the driving shaft of the spin motor 260 and the rotation axis of the spin driving gear 270 passes may penetrate through the spin cover 220 in the up and down or vertical direction. At least one of the drive shaft of the spin motor 320 and the rotation shaft of the spin drive gear 270 may be positioned in the first through-hole 225 of the spin cover 220.

The spin driven gear 280 may be fixed to the base 100. The spin driven gear 280 may be a fixed gear fixedly mounted on the fixed shaft 126 of the base 100. The diameter of the spin driven gear 280 may be larger than the diameter of the spin drive gear 270. The spin drive gear 270 may be directly engaged with the spin driven gear 280 and in this case, the spin drive gear 270 may be rotated while revolving around the outer circumference of the spin driven gear 280.

Alternatively, the spin drive gear 270 and the spin driven gear 280 may be connected to each other via the spin intermediate gear 290 without directly engaging the spin drive gear 270 with the spin driven gear 280. The spin intermediate gear 290 may be rotatably connected to the spin cover 220. The spin intermediate gear 290 may be accommodated in the space S2 inside the spin body 200 like the spin drive gear 270.

The spin intermediate gear 290 may transmit power between the spin drive gear 270 and the spin driven gear 280. The spin intermediate gear 290 may rotate while revolving around the outer circumference of the spin driven gear 280.

The spin intermediate gear 290 may include a first intermediate gear 292 engaged with the spin drive gear 270 and a second intermediate gear 294 rotated together with the first intermediate gear 292 and engaged with the spin driven gear 280. The diameter of the first intermediate gear 292 may be larger than the diameter of the second intermediate gear 294 and the rotation shaft of the first intermediate gear 292 and the second intermediate gear 294 may coincide with each other. According to the above-described configuration, it may be possible to prevent the spin body 200 from being rotated too fast when the spin motor 260 is driven and to secure a sufficient torque required for rotating the spin body 200.

The tilting mechanism 350 may include the tilting motor 360 accommodated in the space S2 inside the spin body 200, the tilting drive gear 370 whose lower portion is connected to the tilting motor 360, and the tilting driven gear 380 connected to the tilting shaft OT or the tilting body 300 and engaged with the tilting drive gear 370 on the spin cover 220. The tilting motor 360 may be positioned below the spin cover 220 and the tilting driven gear 380 may be positioned above the spin cover 220. In other words, the tilting motor 360 and the tilting driven gear 380 may be positioned opposite to each other with respect to the spin cover 220. The power of the tilting motor 360 may be transmitted to the tilting driven gear 380 through the tilting drive gear 370.

The spin cover 220 may include a second through-hole 222 through which at least one of a driving shaft of the tilting motor 360 and a tilting driving gear 370 passes. The second through-hole 222 may pass through the spin cover 220 in the up and down or vertical direction. At least one of the drive shaft of the tilting motor 360 and the tilting drive gear 370 may be positioned in the second through-hole 222 of the spin cover 220. In the spin cover 220, the first through-hole 225 and the second through-hole 222 may be spaced apart from each other.

The driving shaft of the tilting motor 360 may be perpendicular to the rotation axis of the tilting shaft OT. More specifically, the tilting shaft OT may be arranged in the horizontal direction, and the driving shaft of the tilting motor 360 may be arranged in the vertical direction.

The driving shaft of the tilting motor 360 may be parallel to the driving shaft of the spin motor 260. The drive shaft of the tilting motor 360 and the drive shaft of the spin motor 260 may extend in the vertical direction and the drive shaft of the tilting motor 360 and the drive shaft of the spin motor 260 may be spaced apart from each other in the horizontal direction.

The tilting motor 360 may be positioned between the outer circumference of the spin cover 220 and the fixed shaft connection portion 221 in the radial direction of the spin cover 220. In other words, the tilting motor 360 may be arranged at a position eccentric to the rotation axis (OS, see FIGS. 5 to 7) of the spin body. When the spin body 200 is rotated, the tilting motor 360 may revolve about the rotational axis OS of the spin body 200.

The tilting drive gear 370 may be connected to the tilting motor 360 and rotated. The tilting drive gear 370 may be a worm gear having a vertical rotation axis. The tilting drive gear 370 may be provided on the upper side of the spin cover 220 to extend in the vertical direction when connected to the tilting motor 360.

The tilting drive gear 370 may include a gear unit having gear teeth formed on the outer circumference thereof in the form of a screw, a lower rotation shaft projecting to the lower portion of the gear unit, and an upper rotation shaft projecting to the upper portion of the gear unit. The gear unit of the tilting drive gear 370 may be positioned above the second through-hole 222 and may be engaged with the tilting driven gear 380.

The lower rotation shaft including the lower end of the tilting drive gear 370 may be connected to the tilting motor 360 and the upper rotation shaft including the upper end of the tilting drive gear 370 may be rotatably supported by the gear supporter 390.

The tilting driven gear 380 may be positioned above the spin cover 220 and may be connected to at least one of the tilting shaft OT and the tilting body 300. The tilting driven gear 380 may be a spur gear that rotates about the tilting shaft OT. The tilting driven gear 380 may be connected to at least one of the tilting shaft OT and the tilting base 320 to tilt the tilting body 300.

The gear supporter 390 may be mounted on the spin cover 220 and may rotatably support the tilting drive gear 360. The gear supporter 390 may be connected to an upper portion of the tilting drive gear 370. The gear supporter 390 may include a lower fastening portion (or base) 392 which is fastened to the spin cover 220, a rotation axis support portion (or bearing) 394 which rotatably supports the upper rotation shaft of the tilting drive gear 370, and a connection portion (or cylindrical wall) 396 which connects the lower fastening portion 391 and the rotation axis support portion 394.

The lower fastening portion 392 may be fastened to the upper surface of the spin cover 220. The lower fastening portion 392 may include a fastening hole penetrating in the up and down direction, and a fastening member such as a screw, for example, may be fastened to the spin cover 220 through the fastening hole.

The connection portion 396 may surround the tilting drive gear 370, particularly, a portion of the outer circumference of the gear unit. A space for accommodating the tilting drive gear 370 may be formed in the connection portion 396. The connection portion 396 may protect the tilting drive gear 370 from the opposite side of the tilting driven gear 380. The tilting drive gear 370 may be rotated around an upper rotation shaft and a lower rotation shaft which each extend in the vertical direction in a state of being accommodated in a space formed inside the connection portion 396.

The tilting base 320 may be connected to the tilting shaft OT and may be rotated together with the tilting shaft OT when the spin body 200 is rotated. The tilting base 320 may include a tilting shaft connection portion or bracket 321 to which the tilting shaft OT is connected. The tilting shaft connection bracket 321 may be formed at a lower portion of the tilting base 320. The tilting shaft OT may extend in the horizontal direction and may be connected to the tilting shaft connection bracket 321.

The tilting base 320 may have coupling portions or lips 324 and 325 coupled to the inside of the tilting housing 310. A first coupling portion 324 coupled to the inside of the first tilting housing 311 may be formed at one side of the tilting base 320, and a second coupling portion 325 coupled to the inside of the second tilting housing 312 may be formed at the other side of the tilting base 320. For example, the first coupling portion 324 may be formed on the front portion of the tilting base 320, and the second coupling portion 325 may be formed on the rear portion of the tilting base 320.

Each of the coupling portions 324 and 325 may be coupled to the tilting base coupling portions or grooves 314 and 315 (see FIGS. 9 and 10) formed on the inner surface of the tilting housing 310. The tilting base coupling portions 314 and 324 may include a pair of ribs spaced apart by the thickness of the coupling portions 324 and 325 so that the coupling portions 324 and 325 may be inserted and fitted thereinto. However, the configurations of the coupling portions 324 and 325 and the tilting base coupling portions 314 and 324 are not limited thereto.

The tilting base 320 may include a battery mounting portion or mount 322 on which the battery 34 is mounted. The battery mount 322 may include a pocket formed on the upper surface of the tilting base 320. The battery mount 322 may be formed at the center of the tilting base 320, but a position is not limited thereto.

A battery cover 35 may be coupled to the tilting base 320 to prevent any disassembly of the battery 34 accommodated in the battery mount 322. The battery cover 35 may fix an upper side of the battery 34.

At least one fastening portion or tab 35A may be formed on the battery cover 35 and at least one cover fastening portion or boss 322A corresponding to the fastening portion 35A may be formed on the tilting base 320. The cover fastening portion 322A may be a fastening boss but is not limited thereto. The fastening member such as a screw, for example, may pass through the fastening portion 35A of the battery cover 35 and may be fastened to the cover fastening portion 322A of the tilting base 320.

The tilting base 320 may include a PCB mounting portion or mount 323 on which the intermediate PCB 340 may be mounted. The PCB mount 323 may include a pocket formed on the upper surface of the tilting base 320. At least one fastening hole 340A may be formed in the intermediate PCB 340 and a PCB fastening portion or boss 323A may be formed in the PCB mounting portion 323 to correspond to the fastening hole 340A. The PCB fastening portion 323A may be a fastening boss but is not limited thereto. A fastening member such as a screw, for example, may be fastened to the PCB fastening portion 323A through the fastening hole 340A of the intermediate PCB 340. The PCB mount 323 may be formed on the outer side of the battery mount 322.

The intermediate PCB 340 may include an avoiding portion or cut-out 341 to prevent the battery 34 or the battery mount 322 from interfering with the intermediate PCB 340. At least a portion of the battery 34 may be positioned in the cut-out 341 of the intermediate PCB 340. The intermediate PCB 340 may have a shape that is partially removed from the rectangular PCB, and the cut-out 341 may correspond to the removed portion. For example, the intermediate PCB 340 may have a substantially E shape. The size of the tilting base 320 on which both the intermediate PCB 340 and the battery 34 are mounted may be made more compact by the cut-out 341 of the intermediate PCB 340.

The battery 34 may be electrically connected to the intermediate PCB 340. Since both battery 34 and intermediate PCB 340 are arranged on the tilting base 320 and relative movement does not occur between the battery 34 and the intermediate PCB 340, the tangling or twisting of a connection member (electric wire or the like, for example) connecting the battery 34 and the intermediate PCB 340 to each other may be prevented. The tilting base 320 may include a plurality of ribs 326 which may reinforce the strength of the tilting base 320.

Figure 16:
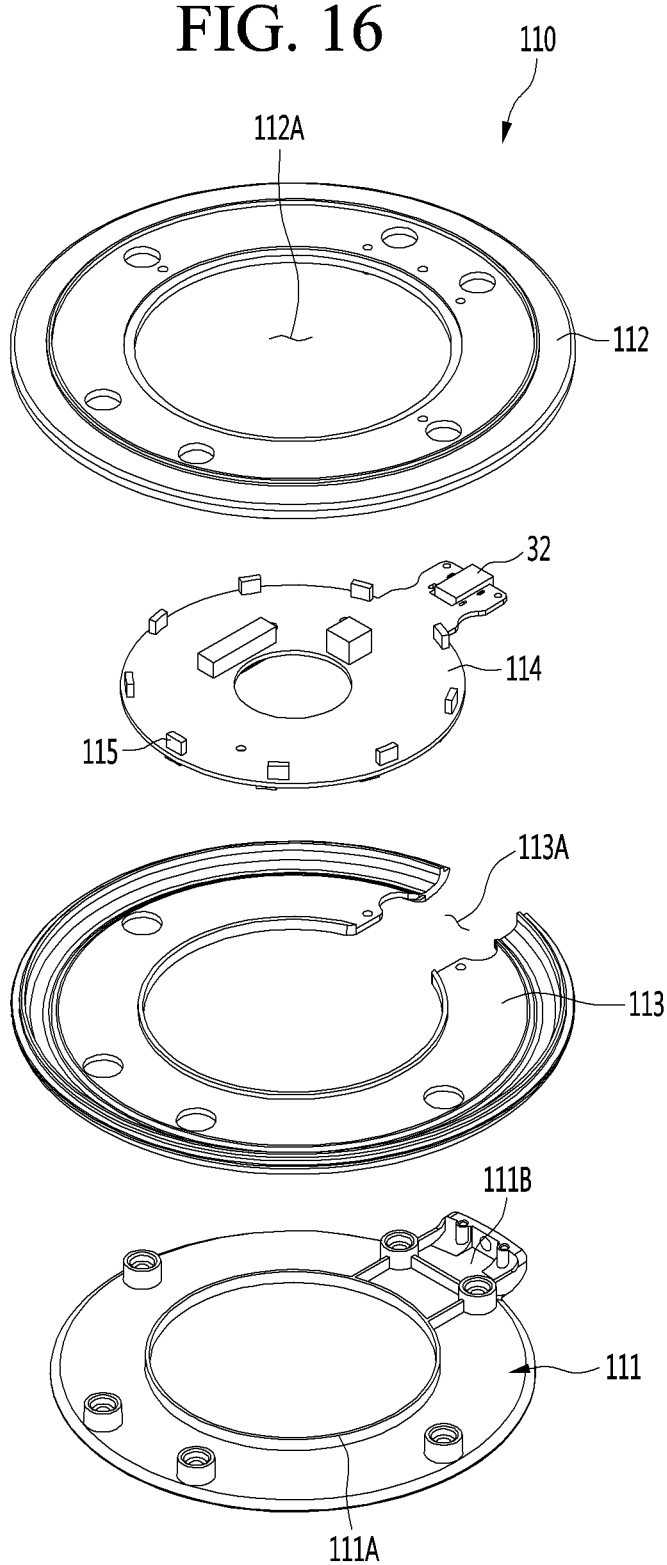
FIG. 16 is an exploded perspective view illustrating a base body according to an embodiment.
Figure 17:
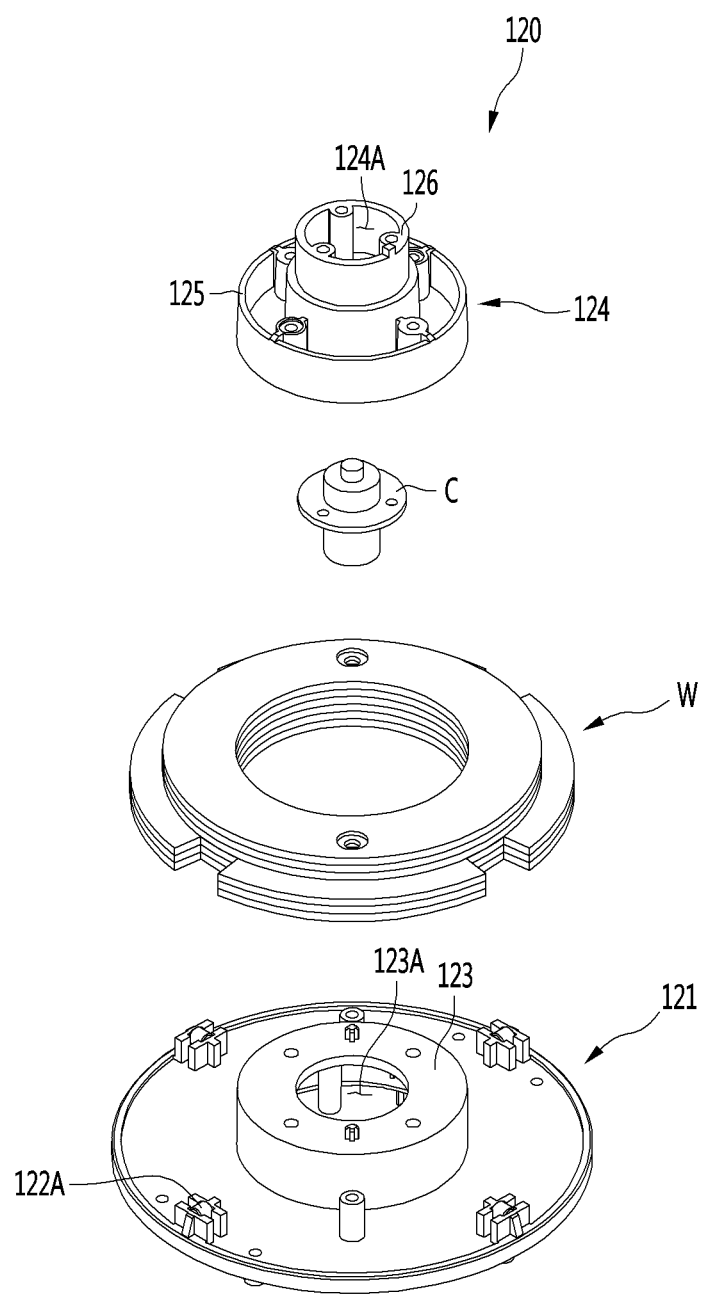
FIG. 17 is an exploded perspective view illustrating a spin body connection portion according to an embodiment.

According to FIGS. 16 and 17, the base 100 may include the base body 110 and the spin body connection portion 120 which may be coupled to the upper side of the base body 110 and to which the spin body 200 may be rotatably connected. With reference to FIG. 16, the robot 1 may further include a base PCB 114 provided on the base 100. The base PCB 114 may be mounted on the base body 110.

The base body 110 may include a lower base 111 and an upper base 112 arranged on an upper side of the lower base 111. The lower base 111 may have a plate shape. The lower base 111 may be formed in a roughly disc shape, but the design is not limited thereto.

The lower substrate 111 may include a PCB fixing portion or bracket 111A to which the base PCB 114 may be fixed. The PCB fixing bracket 111A may protrude upward from the upper surface of the lower base 111 and at least a portion of the base PCB 114 may be positioned inside the PCB fixing bracket 111A.

In addition, the base PCB 114 may be directly connected to the power connection portion or connector 32 or may be electrically connected to the power connector 32 through a connection member such as an electric wire. The lower base 111 may include an accommodation portion or pocket 111B in which the power connection portion 32 may be received. The accommodation pocket 111B may be formed at the edge of the lower base 111. The accommodation pocket 111B may be positioned outside the PCB fixing bracket 111A in the radial direction of the lower base 111. The power connector 32 provided in the accommodation pocket 111B may be connected to the power cord 104 (see FIGS. 5 to 7).

The upper base 112 may be provided on the upper side of the lower base 111. The upper base 112 may be formed in a substantially annular shape and the upper base 112 may have an opening 112A overlapping at least a portion of the base PCB 114 in the up and down or vertical direction. The size of the opening 112A may be the same as or similar to the size of the PCB fixing bracket 111A.

The base PCB 114 may be electrically connected to the drive PCB 230 through connection members C3, C, and C4 (see FIG. 18) such as electric wires. At least a portion of the base PCB 114 may be exposed upwardly through the opening 112A of the upper base 112 and the connection members C3, C, and C4 may be connected to the base PCB 114 exposed through the opening 112A.

The upper base 112 may cover the accommodation pocket 111B of the lower base 111 from above. Accordingly, the power connector 32 may be arranged between the lower base 111 and the upper base 112 and may be protected by the lower base 111 and the upper base 112. In addition, a light source 115 such as an LED may be provided in or on the base PCB 114, in this case, the base body 110 may function as a lighting device, and the base body 110 may function as an interface which provides visual information to the outside.

The base body 110 may further include a decoration member or plate 113 through which light emitted from a light source 115 such as an LED may be transmitted. The decoration member 113 may be provided between the lower base 111 and the upper base 112 and the light emitted from the light source 115 such as an LED may be externally output through the decoration member 113 between the lower base 111 and the upper base 112.

The decoration member 113 may be formed in a roughly arc shape. The inner circumference of the decoration member 113 may be fixed in contact with the outer circumference of the PCB fixing portion 111A of the lower base 111. The decoration member 113 may include an avoiding portion (or cut-out) 113A to allow the accommodation pocket 111B of the lower base 111 to be exposed therethrough. The cut-out 113A may mean between a first end and a second end of the decoration member 113.

With reference to FIG. 17, the spin body connector 120 may include a spin body supporter 121. The spin body supporter 121 may support the spin body 200 in a rotatable manner. The spin body supporter 121 may be provided on the upper surface of the base body 110.

The spin body supporter 121 may include a rolling member 122A which may be in contact with the spin body 200. The rolling member 122A may include at least one of a roller, a ball, and a bearing. The rolling member 122A may be rotatably mounted on the spin body supporter 121. The rolling member 122A may protrude from the upper surface of the spin body supporter 121.

The rolling member 122A may be in contact with the spin body 200, particularly, the spin housing 210, and may help the spin body 200 to be rotated smoothly. A plurality of rolling members 122A may be provided in the spin body supporter 121. The plurality of rolling members 122A may be arranged along the virtual circle and the plurality of rolling members 122A may disperse the load acting on the spin bodies 200 into the base 100, particularly, the spin body supporter 121.

A weight body W which may increase the weight of the base 100 may be provided on the base 100. The weight body W may be heavy compared to a volume thereof and may reduce the entire center of gravity of the robot 1 as much as possible and help the robot 1 not to overturn. The weight body W may be provided on the upper surface of the spin body supporter 121.

The spin body supporter 121 may include a weight body fixing portion or hub 123 on which the weight body W is mounted. The weight body fixing hub 123 may protrude upward from the upper surface of the spin body supporter 121. The weight body W may have an annular shape and the inner circumference of the weight body W may be in contact with the outer circumference of the weight fixing hub 123 so that the weight body W may be mounted on the weight fixing hub 123.

The spin body supporter 121 may have a through-hole 123A penetrating in the vertical direction. The through-hole 123A may be formed at the center portion of the spin body supporter 121 and, more specifically, may be formed in the weight body fixing hub 123. The connection members C3, C, and C4 electrically connecting the base PCB 114 and the drive PCB 230 may pass through the through-holes 123A.

The spin body connector 120 may further include a fixed body 124 provided above the spin body supporter 121. The fixed body 124 may be fastened on the spin body supporter 121 or integrally formed with the spin body supporter 121. The fixed body 124 may be fastened to the upper surface of the weight body fixing hub 123.

The fixed body 124 may include the fixed shaft 126. The fixed shaft 126 may be formed in a hollow cylindrical shape and may be connected to the fixed shaft connection hole 221 (see FIG. 11) formed in the spin cover 220. The fixed shaft 126 may be inserted into the fixed shaft connection hole 221 and the spin body 200 may be rotated about the fixed shaft 126. In other words, the vertical center axis of the fixed shaft 126 may coincide with the rotation axis OS of the spin body 200.

The fixed body 124 may further include a gear mounting portion or hub 125 which is positioned below the fixed shaft 126 and on which the spin driven gear 280 (see FIG. 11) is mounted. The spin driven gear 280 may be mounted to the gear mounting portion 125 with a fastening member such as a screw. The spin driven gear 280 may be rotated such that the spin driven gear 280 is fixedly mounted on the gear mounting hub 125.

A through-hole 124A through which the connection members C3, C, and C4 of the fixed body 124 may pass may be formed. The through-hole 124A may penetrate the fixed body 124 in the vertical direction. The through-hole 124A may communicate with the through-hole 123A formed in the spin body supporter 121.

The connection members C3, C, and C4 through the through-holes 124A of the fixed shaft 126 may connect the base PCB 114 with the drive PCB 230 mounted on the spin body 200. The connection members C3, C, and C4 may include a connector (or electrical connector) C provided in the through-hole 124A, a first electric wire C3 connecting the connector C and the base PCB 114 to each other, and a second electric wire C4 connecting the connector C and the drive PCB 230 to each other. The connector C may be fastened to the fixed body 124 within the through-hole 124A. Thus, the base PCB 114 and the drive PCB 230 may be connected to each other and the tangling of the electric wires may be reduced, as compared with the case where the connection member is composed of only the electric wires directly connecting the base PCB 114 and the drive PCB 230.

Figure 18:
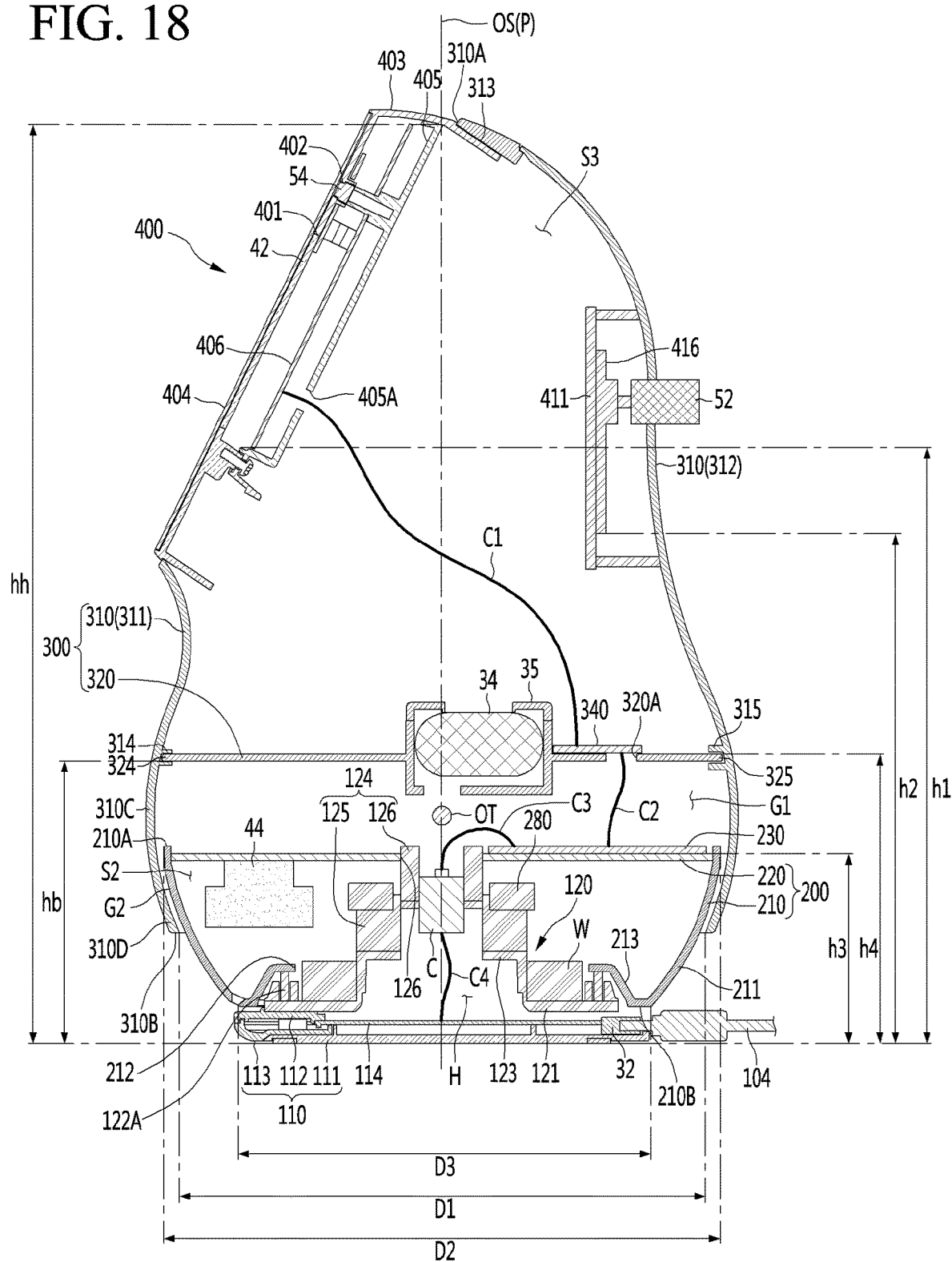
FIG. 18 is a sectional view taken along line A-A in FIG. 4.

According to FIG. 18, the upper end 310A of the tilting housing 310 may be higher than the upper end 210A of the spin housing 210, and the tilting housing 310 may cover the upper end 210A of the spin housing 210. The lower end 310B of the tilting housing 310 may be lower than the upper end 210A of the spin housing 210, may be higher than the lower end 210B of the spin housing 210, and the tilting housing 310 may shield a portion of the outer circumference of the spin housing 210.

The tilting housing 310 may include a gap shielding portion 310C for shielding a gap G1 between the tilting base 310 and the spin cover 210. The inner surface of the gap shielding portion 310C of the tilting housing 310 may face the gap G1 between the spin cover 210 and the tilting base 310 and the gap G1 may be shielded at the outside of the gap G1. When the tilting housing 310 includes the gap shielding portion 310C, various components (for example, spin motor 260, tilting drive gear 370, tilting driven gear 380, PCB 230, and the like) positioned in the gap G1 between the tilting base 310 and the spin cover 210 may be protected by the gap shielding portion 310.

The lower portion of the tilting housing 310 may surround the outer peripheral surface of the spin housing 210. The lower portion of the tilting housing 310 may overlap a portion including the upper end 210A of the spin housing 210 in a horizontal direction and the upper end 210A of the spin housing 210 may be hidden from the outside by being covered by the tilting housing 310.

A gap G2 may be formed between the tilting housing 310 and the spin housing 210. The gap G2 may be formed between the inner circumferential surface of the tilting housing 310 and the outer circumferential surface of the spin housing 210. The lower portion of the tilting housing 310 may have a shape in which the inner diameter gradually decreases toward the lower side and the lower end 310B of the tilting housing 310 may overlap with the spin housing 210 in the vertical direction and the horizontal direction. To this end, the lower end inner diameter D1 of the tilting housing 310 may be smaller than the upper outer diameter D2 of the spin housing 210 and larger than the lower end outer diameter D3 of the spin housing 210.

A portion of the tilting housing 310 that overlaps with the spin housing 210 in the vertical direction and the horizontal direction may be a spin housing shielding portion 310D that shields the spin housing 210. The spin housing shielding portion 310D may include a lower end 310B of the tilting housing 310. Foreign matter such as dust may be minimally penetrated into the robot 1 through the gap G2 between the tilting housing 310 and the spin housing 210 by the spin housing shielding portion 310D.

The tilting base 320 may cover the upper space S3 formed in the tilting housing 310. The lower hollow body 213 of the spin housing 210 may include a shielding body extending so as to be invisible from the side of the rolling member 122A and a contact body horizontally extending from the upper portion of the shielding body and being seated on the rolling member 122A.

The base through-hole 212 may be formed in a hollow shape in the contact body, and the lower hollow body 213 may be rotated along a plurality of rolling members 122A when the lower surface of the contact body is in contact with the rolling member 122A. In the base through-hole 212, the base 100 may be positioned, and more particularly the spin body connector 120 may be positioned.

A hollow H through which the connection members C3, C, and C4 electrically connecting the drive PCB 230 and the base PCB 114 pass may be formed in the spin body connection portion 120 of the base 100. The hollow H may include a through-hole 124A formed in the fixed body 124 and a through-hole 123A formed in the spin body supporter 121. The central axis of the hollow H may coincide with the rotation axis OS of the spin body 200.

As described above, the interface PCBs 406 and 416 provided in the interface modules 400 and 410 may be electrically connected to the intermediate PCB 340 disposed in the tilting base 320. At least one of the first interface PCB 406 and the second interface PCB 416 may be connected to the intermediate PCB 340. Hereinafter, as illustrated in FIG. 18, the case where the first interface PCB 406 is connected to the intermediate PCB 340 and the second interface PCB 416 is not connected to the intermediate PCB 340 will be described as an example. In this case, the second interface PCB 416 may be electrically connected to the first interface PCB 406.

The connection member C1 electrically connecting the interface PCBs 406 and 416 and the intermediate PCB 340 may include electric wires and the like, may be positioned in the upper space S3 inside the tilting housing 310, and may be positioned on the upper side of the tilting base 320. The interface PCBs 406 and 416 and the intermediate PCB 340 may be tilted together with the tilting body 300 so that relative movement does not occur between the interface PCBs 406 and 416 and the intermediate PCB 340. Therefore, deformation or tangling of the connection member C1 connecting the interface PCBs 406 and 416 and the intermediate PCB 340 may not occur.

The drive PCB 230 disposed on the spin body 200 may be electrically connected to the intermediate PCB 340 disposed on the tilting base 320. The connection member C2 electrically connecting the drive PCB 230 and the intermediate PCB 340 may include electric wires and the like and may be positioned at a gap G1 between the tilting base 320 and the spin cover 220.

The through-hole 320A through which the connection member C2 connecting the drive PCB 230 and the intermediate PCB 340 passes may be formed on the tilting base 320. However, the connection member C2 connecting the drive PCB 230 and the intermediate PCB 340 may pass through the gap between the outer circumference of the tilting base 320 and the inner surface of the tilting housing 310 instead of passing through the through-hole 320.

The tilting operation of the tilting body 300 may cause a relative movement between the intermediate PCB 340 and the drive PCB 230. Therefore, the connection member C2 electrically connecting the drive PCB 230 and the intermediate PCB 340 may include a flexible material or a length that cannot be broken even when the tilting of the tilting body 300 occurs.

The distance between the drive PCB 230 and the intermediate PCB 340 may be closer than the distance between the interface PCB 406 and the intermediate PCB 340. In other words, the length of the connection member C2 connecting the drive PCB 230 and the intermediate PCB 340 may be shorter than the length of the connection member C1 connecting the interface PCB 406 and the intermediate PCB 340. With respect to the lower surface of the base 100, the height h4 to the intermediate PCB 340 may be higher than the height h3 to the drive PCB 230 and may be lower than the heights h1 and h2 between the PCBs 406 and 416. Since the intermediate PCB 340 and the drive PCB 230 may be relatively adjacent to each other, the length of the electric wire may be shorter than a case where the interface PCBs 406 and 416 are directly connected to the drive PCB 230, and tangling or twisting of the electric wire may be minimized.

The drive PCB 230 and the intermediate PCB 340 may be at least partially overlapped with each other in the up and down direction and the connection member C2 connecting the drive PCB 230 and the intermediate PCB 340 may be connected to overlapping portions for each of the drive PCB 230 and the intermediate PCB 340. Accordingly, the length of the connection member 340 may be short and the internal structure thereof may be simplified.

The battery 34 mounted on the tilting base 320 may be provided at a position overlapping with the tilting shaft OT of the tilting body 300 in the up and down direction. Thus, the influence of the weight of the battery 34 on the tilting of the tilting body 300 may be minimized.

In addition, the first interface module 400 may be positioned on a first side (for example, a front side) of the virtual vertical plane P passing through the tilting shaft OT and the battery 34 may be positioned on a second side (for example, a rear side) of the virtual vertical plane P or eccentrically on the other side. Accordingly, the torque due to the weight of the first interface module 400 and the torque due to the weight of the battery 34 may cancel each other so that the tilting of the tilting body 300 may be smoothly performed.

The height hb from the lower surface of the base 100 to the tilting base 320 may be less than half the height hh from the lower surface of the base 100 to the upper end 310A of the tilting housing 310. In other words, the height of the tilting base 320 on which the battery 34 is mounted may be relatively low as compared with the entire height of the robot 1, and the center of gravity of the robot 1 may be lowered.

Except for the configuration of the tilting mechanism 350', the robot according to the present embodiment may be the same as the robot according to the above-described embodiment, so that duplicated description will be omitted and differences will be mainly described. The tilting mechanism 350' according to the present embodiment may include a tilting motor 360', a tilting drive gear 370' which is connected to the tilting motor 360', and a tilting driven gear 380 which is connected to the tilting shaft OT or the tilting body 300 and receives the power of the tilting drive gear 370'. The tilting mechanism 350' may further include a tilting intermediate gear 371 engaged with the tilting drive gear 370' and the tilting driven gear 380, respectively.

The tilting motor 360' may be arranged on the upper surface of the spin cover 220. In other words, both tilting motor 360' and spin motor 260 may be provided on the upper surface of the spin cover 220. Accordingly, since the connection member (for example, electric wire) for electrically connecting the drive PCB 230 and the tilting motor 360' does not need to pass through the spin cover 220, the connection between the connection member and the tilting motor 360' may be made easier.

The tilting motor 360', the spin motor 260 and the drive PCB 230 may be rotated together with the spin body 200 in the same manner as in the above-described embodiment, so that the connection member electrically connecting the respective motors 260 and 360' and the drive PCB 230 may not be tangled, twisted, or deformed, and structural integrity may be maintained.

The tilting drive gear 370' may be connected to the tilting motor 360 and rotated. The tilting drive gear 370' may be a spur gear. The tilting drive gear 370' may be engaged with the tilting driven gear 380. However, the tilting drive gear 370' and the tilting driven gear 380 may be connected to each other through at least one tilting intermediate gear 371 without directly engaging the tilting drive gear 370' with the tilting driven gear 380.

The tilting intermediate gear 371 may be positioned above the spin cover. The diameter of the tilting intermediate gear 371 may be greater than the diameter of the tilting drive gear 370'. Thus, when the tilting motor 360' is driven, the tilting body may be prevented from being tilted too fast, and the torque necessary to tilt the tilting body may be sufficiently secured.

The robot according to the present embodiment may be the same as the robot according to the above-described one embodiment except for the spin motor 260' of the spin mechanism 250', so the overlapping contents will be omitted and differences will be mainly described. The spin motor 260' included in the spin mechanism 250' according to the present embodiment may be arranged below the spin cover 220. The spin motor 260' may be provided in the space S2 inside the spin body 200 and may be protected by the spin body 200.

Both the tilting motor 360 and the spin motor 260' may be provided on the lower surface of the spin cover 220. Accordingly, a connection member (for example, electric wire) for electrically connecting the drive PCB 230 and the respective motors 260' and 360 may pass through the first through-hole 229A formed in the spin cover 220. As described above, since the tilting motor 360, the spin motor 260', and the drive PCB 230 are rotated together with the spin body 200, the connection member electrically connecting the respective motors 260' and 360 and the drive PCB 230 may not be tangled, twisted, or deformed, and structural integrity may be maintained.

A spin motor support portion or bracket 261 for supporting the spin motor 260' may be formed on the lower surface of the spin cover 220 and the spin motor 260' may be suspended from the spin motor support portion 261. The spin motor 260' may be provided below the spin drive gear 270, and the drive shaft of the spin motor 260' may protrude upward. However, the present disclosure is not limited thereto, and the spin motor 260' may be arranged above the spin drive gear 270.

Figure 19:
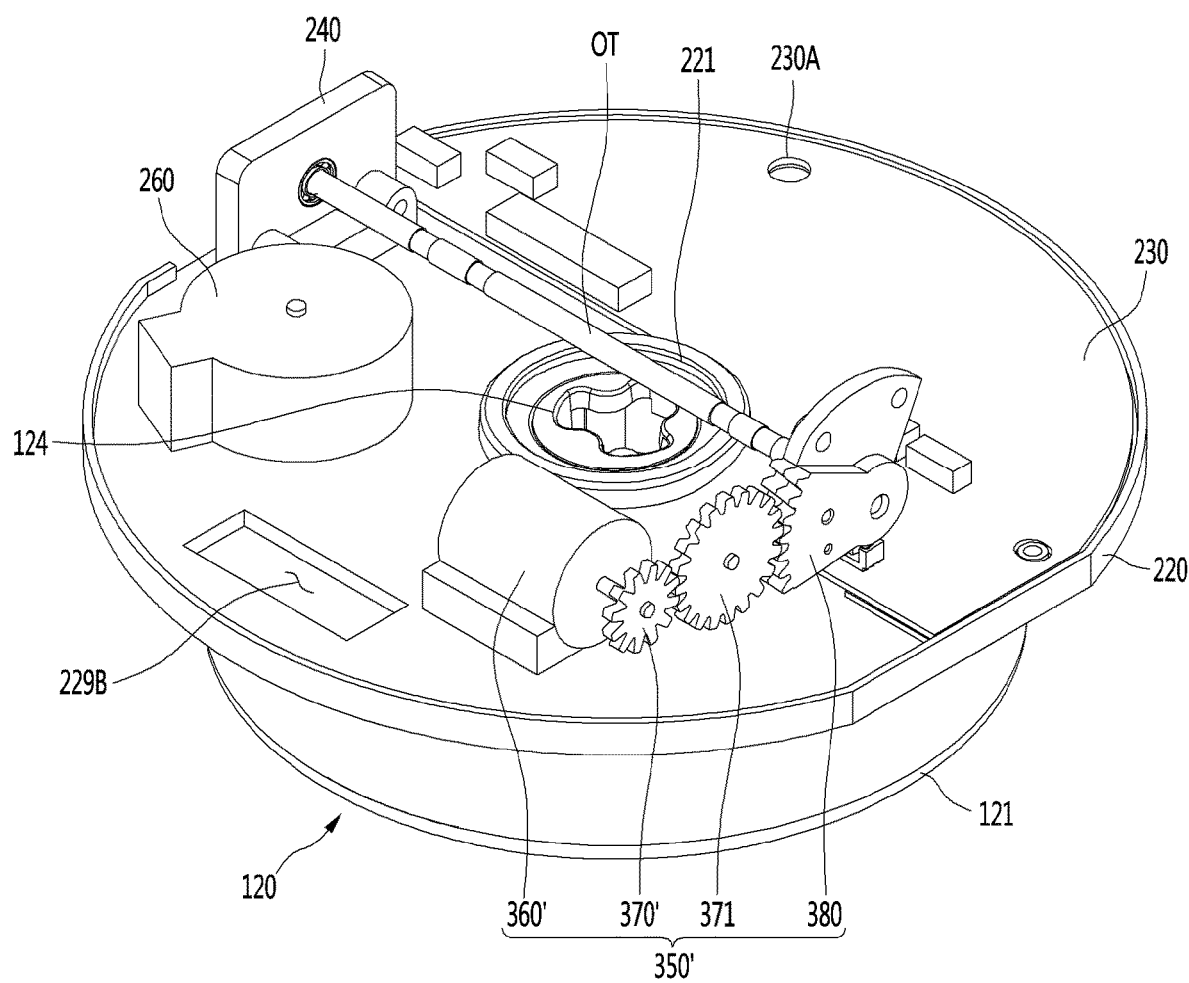
FIG. 19 is a perspective view illustrating a base, a spin cover, a spin mechanism, and a tilting mechanism according to another embodiment.
Figure 20:
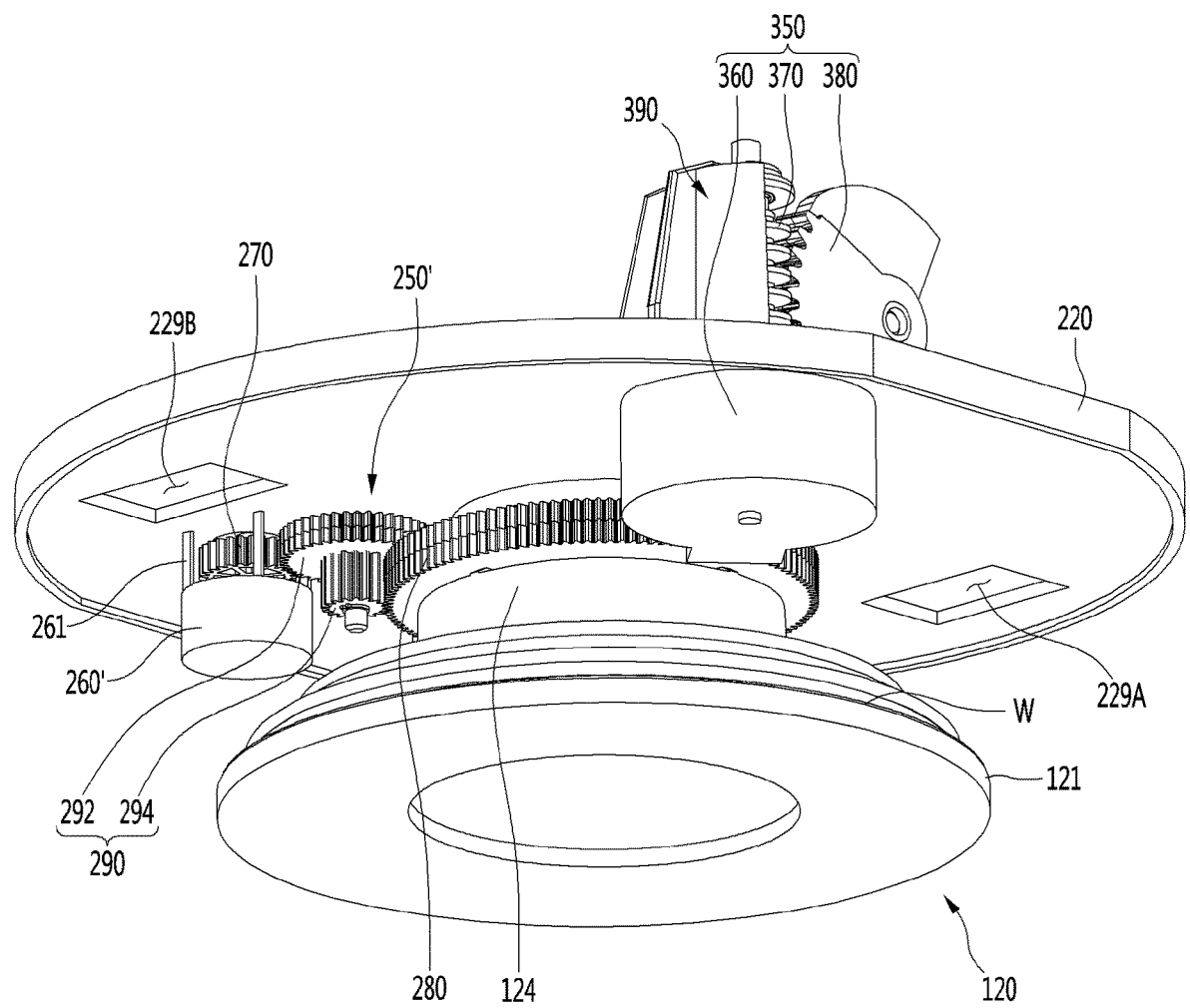
FIG. 20 is a bottom perspective view illustrating the base, the spin cover, the tilting mechanism, and the spin mechanism according to another embodiment.
Figure 21:
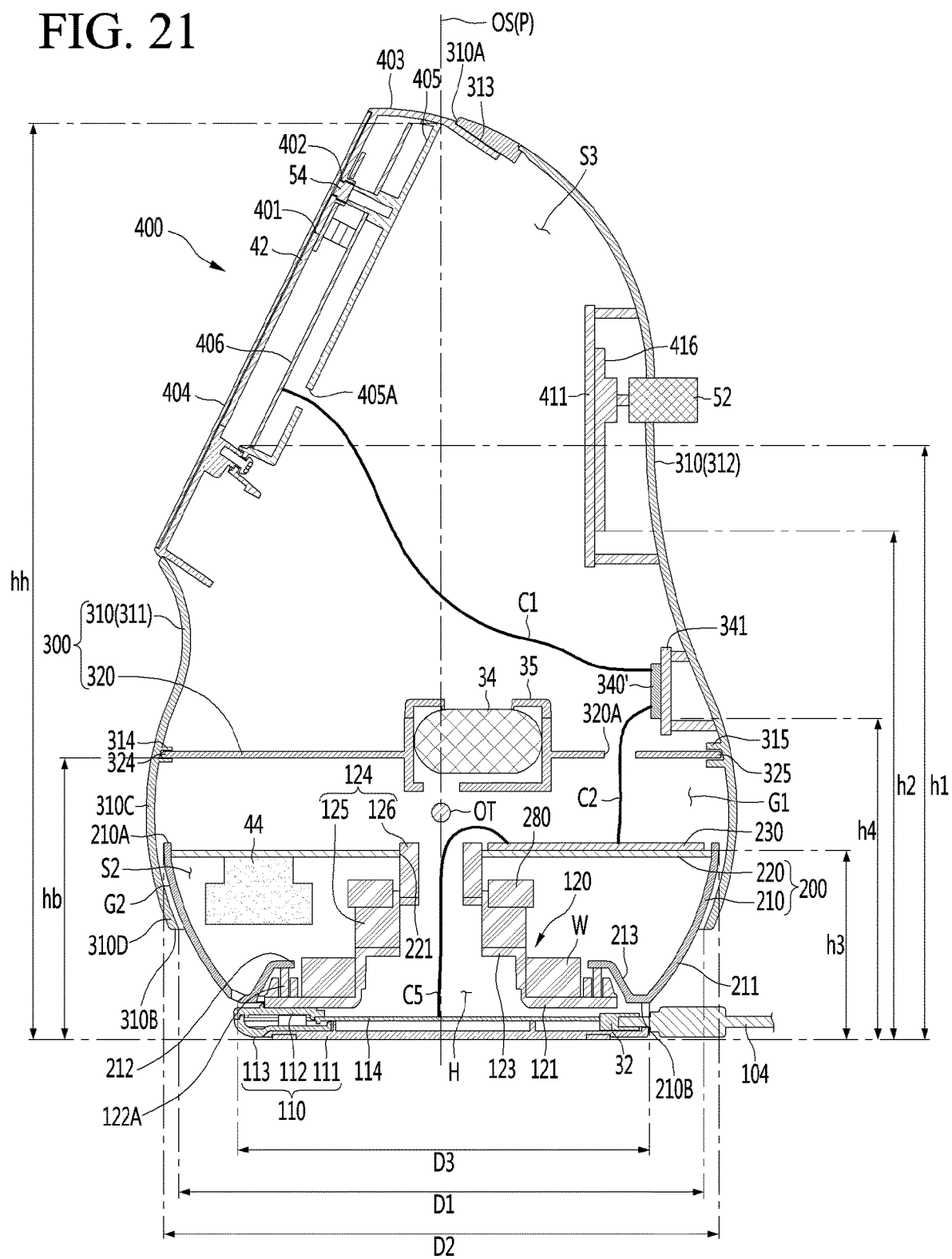
FIG. 21 is a sectional view illustrating a robot according to another embodiment.

A configuration in which the tilting motor 360' is provided on the upper side of the spin cover 220 and the spin motor 260' is provided on the lower side of the spin cover 220 by combining an embodiment illustrated in FIG. 19 and an embodiment illustrated in FIG. 20 is also possible. In this case, a connection member for electrically connecting the drive PCB 230 and the spin motor 260' may pass through the first through-hole 229A formed in the spin cover 220.

The robot according to this embodiment may be the same as the above-described embodiment except for the installation position of the intermediate PCB 340' and a configuration of the connection member C5 connecting the drive PCB 230 and the base PCB 114. Therefore, duplicate contents are omitted and the differences are mainly explained.

The intermediate PCB 340' according to the present embodiment may be mounted on the tilting housing 310 instead of the tilting base 320. The inner surface of the tilting housing 310 may include a PCB bracket 341 on which an intermediate PCB 340' may be mounted. Based on the lower portion of the base 100, the height h4 up to the intermediate PCB 340' is higher than the height h3 up to the drive PCB 230 and is lower than the heights h1 and h2 between the interface PCBs 406 and 416.

The connection member C5 for electrically connecting the drive PCB 230 and the base PCB 114 may not include the connector C (see FIG. 18) but may be formed of a single electric wire. The coupling member C5 may pass through the hollow H formed in the spin body connection portion 120.

According to the embodiment, since the spin motor, the tilting motor, and the drive PCB are mounted on the spin body, the relative motion of the respective motors and the drive PCB do not occur, and thus tangling or twisting of the connection member connecting respective motors and the drive PCB may not occur.

In addition, since the spin motor and the tilting motor are positioned opposite to each other with respect to the spin cover, each motor may be disposed on the opposite side of the spin cover to efficiently utilize the area of the spin cover, the spin cover may be compact, and an area on which the PCB is mounted may be sufficiently secured. In addition, since a hollow is formed in the spin body connection portion included in the base, a connection member for electrically connecting the base PCB and the drive PCB may be easily connected through the hollow.

In addition, since the center axis of the hollow formed in the spin body connection portion coincides with the virtual rotational axis of the spin body, the tangling or twisting of the connection member connecting the base PCB and the drive PCB may be minimized even if the spin body is rotated. In addition, since the interface electrically connected to the drive PCB is accommodated in the spin body, the interface and the drive PCB may be rotated together to cause no relative movement, and tangling or twisting of the connection member connecting the interface and the drive PCB may not occur.

In addition, since the spin body includes a through-hole, a connection member such as an electric wire or the like connecting the drive PCB and the interface may be easily connected through the through-hole. In addition, since the interface PCB and the intermediate PCB are tilted together, relative motion may not occur, and the intermediate and the drive PCBs may be relatively adjacent to each other, the length of the connection member may be shortened and the tangling and twisting of the connection member may be minimized, compared to a case where the interface PCB and the drive PCB are directly connected.

In addition, since the drive PCB faces the lower surface of the tilting base by being disposed on the upper surface of the spin body, the drive PCB may be protected between the spin body and the tilting base. In addition, since the through-hole is formed in the tilting base, the connection member for electrically connecting the drive PCB and the intermediate PCB may be easily connected.

In addition, since the battery and the intermediate PCB are disposed on the tilting base, the battery and the intermediate PCB may be tilted together to cause no relative movement, and twisting or twisting of the connection member connecting the battery and the intermediate PCB may not occur. In addition, since the battery and the tilting shaft are overlapped in the up and down direction, the influence of the weight of the battery on the tilting operation may be minimized.

In addition, since the battery is disposed at a relatively low position, the center of gravity of the robot may be lowered and the risk of overturning may be reduced. In addition, since the interface module is positioned on one side of a virtual vertical plane passing through the tilting shaft and the battery is disposed on the other side of the virtual vertical plane or eccentrically disposed on the other side, the torque due to the weight of the interface module and the torque due to the weight of the battery may cancel each other so that the tilting operation may be made more smooth.

A robot may include a spin motor, a drive motor, and a PCB which is connected electrically to the spin motor and the drive motor can be mounted on a spin body. Accordingly, the spin motor, the driving motor, and the PCB may be rotated together with the spin body, so that relative movement does not occur between the PCB and each motor, and the tangling or twisting of the connection member electrically connecting each motor and the PCB cannot occur.

The robot may include: a base; a spin body which is rotatably connected to the base; a spin motor which provides power to rotate the spin body with respect to the base; a tilting body which is connected to a tilting shaft connected to the spin body and configured to be tiltable with respect to the spin body; a tilting motor which provides power for tilting the tilting body about the tilting shaft; and a printed circuit board, PCB which is electrically connected to the spin motor and the tilting motor, in which the spin motor, the tilting motor, and the PCB is mounted on the spin body.

The spin body may include a spin housing which has a space therein; and a spin cover which covers the space from above and on which the PCB is mounted. One out of the spin motor and the tilting motor may be disposed on a lower surface of the spin cover, and the other may be disposed on an upper surface of the spin cover. Accordingly, each motor may be disposed on the opposite side of the spin cover, so that the area of the spin cover can be efficiently utilized, and a sufficient area on which the PCB is mounted can be secured while keeping the spin cover compact.

The base may include a hollow through which a connection member for electrically connecting the PCB of the spin body and a base PCB passes. Accordingly, the PCB of the spin body and the base PCB may be easily connected with each other.

The base may include: a base body on which a base printed circuit board, base PCB electrically connected to the PCB is disposed; and a spin body connection portion which is disposed above the base body and to which the spin body is rotatably connected, in which the spin body connection portion may include a hollow space through which a connection member electrically connecting the PCB to the base PCB passes. The center axis of the hollow space may coincide with the virtual rotation axis of the spin body. Thus, even if the spin body is rotated, the tangling or twisting of the connection member connecting the base PCB and the PCB may be minimized.

The robot may further include an interface which is electrically connected to the PCB and accommodated in the spin body. Accordingly, the interface and the PCB may be rotated together with the spin body, and relative motion may not occur between the interface and the PCB, so that the tangling and twisting of the connection member connecting the interface and the PCB may not occur.

The PCB may be mounted on an upper surface of the spin body, and the spin body may include a through-hole through which a connection member electrically connecting the PCB to the interface passes. Accordingly, the PCB mounted on the outside of the spin body and the interface disposed in the inner space of the spin body may be easily connected by a connection member such as an electric wire. The tilting body may include a tilting base which is positioned above the spin body and is connected to the tilting shaft to be tiltable; and a tilting housing in which the tilting base may be fixed to the inside thereof.

The robot may further include: an interface module which is mounted on the tilting housing and positioned above the tilting base; an interface printed circuit board, interface PCB which is provided in the interface module; and an intermediate printed circuit board, intermediate PCB which is mounted on the tilting base and electrically connected to the interface PCB and the PCB, respectively. Accordingly, since the interface PCB and intermediate PCB are tilted together with the tilting body, relative motion may not occur, and the middle and the intermediate PCB and the PCB may be relatively close to each other, the length of the connection member may be shorter than a case where the interface PCB and the PCB are directly connected and tangling or torsion of the connection member may be minimized.

The robot may further include an interface module which is mounted on the tilting housing and positioned above the tilting base; an interface printed circuit board, interface PCB which is provided in the interface module; and an intermediate printed circuit board, intermediate PCB which is mounted on the tilting body. The tilting base may include a through-hole through which a connection member electrically connecting the PCB and the intermediate PCB passes.

The robot may further include a battery which is mounted on the tilting base and electrically connected to the intermediate PCB. Accordingly, the battery and the intermediate PCB may be tilted together with the tilting base, so that relative movement between the battery and the intermediate PCB may not occur, so that tangling or twisting of the connection member connecting the battery and the intermediate PCB may not occur.

In the robot, the interface PCB and the intermediate PCB, which are tilted together with the tilting body, may be electrically connected, and the intermediate PCB may be electrically connected to the drive PCB that is not tilted, and the distance between the drive PCB and the intermediate PCB may be closer than the distance between the interface PCB and the intermediate PCB. Accordingly, since the interface PCB and the intermediate PCB are tilted together, the relative movement therebetween may not occur, and the relative distance between the interface PCB and the drive PCB may be relatively short, the length of the connection member may be shorter than that of the direct connection between the interface PCB and the drive PCB, the tangling and the twisting of the connection member may be minimized.

The robot may include: a base; a spin body which is rotatably connected to the base; a tilting body which is connected to a tilting shaft connected to the spin body and configured to be tiltable with respect to the spin body; an interface module which is mounted on the tilting body, tilted together with the tilting body, and includes at least one interface; an interface printed circuit board, interface PCB which is provided in the interface module; a drive printed circuit board, drive PCB which is disposed in the spin body; and an intermediate PCB which is disposed on the tilting body and electrically connected to the interface PCB and the drive PCB, respectively, in which the distance between the drive PCB and the intermediate PCB is shorter than the distance between the interface PCB and the intermediate PCB.

A height up to the intermediate PCB from a lower surface of the base may be higher than the height up to the drive PCB, and lower than a height up to the interface PCB from the lower surface. The tilting body may include a tilting base which is connected to the tilting shaft and configured to be tiltable with respect to the spin body and on which the intermediate PCB is mounted; and a tilting housing in which the tilting base is fixed to the inside thereof and on which the interface module is mounted.

The drive PCB may be disposed on an upper surface of the spin body to face a lower surface of the tilting base. Accordingly, the drive PCB can be protected at a space between the spin body and the tilting base. The intermediate PCB may be seated on the upper surface of the tilting base, and the tilting base may include a through-hole through which a connection member electrically connecting the drive PCB and the intermediate PCB passes. Thus, the drive PCB and the intermediate PCB, which are positioned on opposite sides to each other with respect to the tilting base, may be easily connected.

In the robot, both the battery and the PCB connected electrically to the battery may be mounted on the tilting base. Accordingly, relative movement may not occur due to the tilting of the battery and the PCB, so that tangling or twisting of the connection member for electrically connecting the battery to the PCB may not occur.

The robot may include: a base; a spin body which is rotatably connected to the base; a tilting base which is connected to the tilting shaft connected to the spin body to be tiltable; a tilting housing in which the tilting base is coupled to the inside thereof; a battery which is mounted on the tilting base; and a printed circuit board, PCB which is mounted on the tilting base and electrically connected to the battery. The battery may be disposed at a position overlapping with the tilting shaft in an up and down direction. Accordingly, the impact of battery weight on tilting may be minimized.

The height from the lower surface of the base to the tilting base may be less than half the height from the lower surface of the base to the upper end of the tilting housing. Accordingly, the height of the tilting base on which the battery is mounted may be lowered, so that the center of gravity of the robot may be lowered, and the risk of the robot being overturned may be reduced.

The robot may further include an interface module which is mounted on the tilting housing, the interface module being positioned at one side of a virtual vertical plane passing through the tilting shaft, and the battery may be positioned at the other side of the virtual vertical plane or may be disposed eccentrically to the other side thereof. Thereby, the torque due to the weight of the interface module and the torque due to the weight of the battery may cancel each other so that the tilting operation may be made more smooth.

The description above is merely illustrative of the technical idea of the present invention, and various modifications and changes may be made by those skilled in the art without departing from the essential characteristics of the present invention.

Therefore, The embodiments disclosed in the present invention are not intended to limit the technical ideas of the present invention but to illustrate them, and the scope of the technical idea of the present invention is not limited by these embodiments.

The scope of protection of the present invention should be construed according to the following claims, and all technical ideas within the scope of equivalents thereof should be construed as being included in the scope of the present invention.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A robot comprising:
    a base;
    a first body connected to the base and configured to be rotatable;
    a first motor which provides power to rotate the first body with respect to the base;
    a second body which is fixed to a shaft connected to the first body and configured to be tiltable with respect to the first body;
    a second motor which provides power to tilt the second body about the shaft; and
    a first printed circuit board (PCB) electrically connected to the first motor and the second motor, wherein the first motor, the second motor, and the PCB are mounted on the first body,
    wherein the second body includes:
        a tilting base positioned above the first body and connected to the shaft, the tilting base being configured to be tiltable with respect to the first body; and
        a tilting housing in which the tilting base is fixed, an upper space being provided inside the tilting housing, and the tilting base being accommodated in the upper space.

2. The robot according to claim 1, wherein the first body includes:
    a spin housing which has a space formed therein; and
    a spin cover connected to the spin housing and on which the first PCB is mounted.

3. The robot according to claim 2, wherein one of the first motor and the second motor is mounted on a lower surface of the spin cover, and the other of the first motor and the second motor is mounted on an upper surface of the spin cover.

4. The robot according to claim 2, wherein the base includes:
    a base body on which a base PCB electrically connected to the first PCB is mounted; and
    a first body connector which is attached to a top of the base body and to which the first body is rotatably connected,
    wherein the first body connector includes a hollow space through which a connection member electrically connecting the first PCB to the base PCB passes.

5. The robot according to claim 4, wherein a center axis of the hollow space coincides with a rotation axis of the first body.

6. The robot according to claim 2, wherein the first motor is provided between the spin cover and the tilting base.

7. The robot according to claim 2, wherein the second motor is accommodated in a space formed inside of the spin housing.

8. The robot according to claim 1, further comprising an interface which is electrically connected to the first PCB and accommodated in the first body.

9. The robot according to claim 8, wherein the first PCB is mounted on an upper surface of the first body, and wherein the first body includes a through-hole through which a connection member electrically connecting the first PCB to the interface passes.

10. The robot according to claim 1, further comprising:
    at least one interface which is mounted on the tilting housing and positioned above the tilting base;
    an interface PCB electrically attached to the at least one interface; and an intermediate PCB which is mounted on the tilting base and electrically connected to the interface PCB and the first PCB, respectively.

11. The robot according to claim 1, further comprising:
an interface which is mounted on the tilting housing and positioned above the tilting base;
an interface PCB electrically attached to the interface; and
an intermediate PCB which is mounted on the second body, wherein the tilting base includes a through-hole through which a connection member electrically connecting the first PCB and the intermediate PCB passes.

12. The robot according to claim 11, further comprising:
a battery which is mounted on the tilting base and electrically connected to the intermediate PCB.

13. A robot comprising:
a base;
a first body which is rotatably connected to the base;
a second body fixed to a shaft connected to the first body and configured to be tiltable with respect to the first body;
at least one interface mounted on the second body, the at least one interface configured to be tilted together with the second body;
an interface printed circuit board (PCB) electrically attached to the interface;
a drive PCB provided in the first body; and
an intermediate PCB which is mounted on the second body and electrically connected to the interface PCB and the drive PCB,
wherein a distance between the drive PCB and the intermediate PCB is less than a distance between the interface PCB and the intermediate PCB,
wherein the second body includes:
a tilting base positioned above the first body and connected to the shaft, the tilting base being configured to be tiltable with respect to the first body; and
a tilting housing in which the tilting base is fixed, an upper space being provided inside the tilting housing,
wherein the tilting base is accommodated in the upper space.

14. The robot according to claim 13,
wherein a height from a lower surface of the base to the intermediate PCB is higher than a height from a lower surface of the base to the drive PCB and lower than a height from a lower surface of the base to the interface PCB.

15. The robot according to claim 13,
wherein the drive PCB is mounted on an upper surface of the first body to face a lower surface of the tilting base.

16. The robot according to claim 13,
wherein the intermediate PCB is seated on an upper surface of the tilting base, and
wherein the tilting base includes a through-hole through which a connection member electrically connecting the drive PCB and the intermediate PCB passes.

17. A robot comprising:
a base;
a first body configured to horizontally rotate with respect to the base;
a tilting base positioned above the first body and connected to a shaft connected to the first body, the tilting base being configured to be tiltable with respect to the first body; and
a tilting housing in which the tilting base is fixed, an upper space being provided inside the tilting housing,
a battery mounted on the tilting base; and
a printed circuit board (PCB) mounted on the tilting base and electrically connected to the battery,
wherein the tilting base is accommodated in the upper space.

18. The robot according to claim 17, wherein the battery at least partially overlaps with the shaft in a vertical direction.

19. The robot according to claim 17, wherein a height from a lower surface of the base to the tilting base is less than half a height from the lower surface of the base to an upper end of the tilting housing.

20. The robot according to claim 17, further comprising:
at least one interface mounted on the tilting housing, wherein the at least one interface is eccentric to a vertical axis of rotation of the first body, and wherein the battery is eccentric to the vertical axis of rotation of the first body opposite to the at least one interface.

* * * * *